United States Patent
Heben et al.

(10) Patent No.: US 10,043,922 B2
(45) Date of Patent: Aug. 7, 2018

(54) BACK CONTACT LAYER FOR PHOTOVOLTAIC CELLS

(71) Applicant: The University of Toledo, Toledo, OH (US)

(72) Inventors: Michael J. Heben, Ottawa Hills, OH (US); Adam B. Phillips, Toledo, OH (US); Rajendra R. Khanal, Toledo, OH (US); Victor V. Plotnikov, Toledo, OH (US); Alvin D. Compaan, Holland, OH (US)

(73) Assignee: The University Of Toledo, Toledo, OH (US)

( * ) Notice: Subject to any disclaimer, the term of this patent is extended or adjusted under 35 U.S.C. 154(b) by 0 days.

(21) Appl. No.: 14/421,718

(22) PCT Filed: Aug. 13, 2013

(86) PCT No.: PCT/US2013/054783
§ 371 (c)(1),
(2) Date: Feb. 13, 2015

(87) PCT Pub. No.: WO2014/028526
PCT Pub. Date: Feb. 20, 2014

(65) Prior Publication Data
US 2015/0221790 A1 Aug. 6, 2015

Related U.S. Application Data

(63) Continuation-in-part of application No. 13/515,686, filed as application No. PCT/US2010/053167 on Oct. 19, 2010, now Pat. No. 8,829,342.
(Continued)

(51) Int. Cl.
*H01L 31/0224* (2006.01)
*H01L 31/073* (2012.01)
(Continued)

(52) U.S. Cl.
CPC ...... *H01L 31/022425* (2013.01); *B82Y 10/00* (2013.01); *B82Y 20/00* (2013.01);
(Continued)

(58) Field of Classification Search
CPC .......... H01L 31/022425; H01L 31/073; H01L 31/0725; H01L 31/076; B82Y 10/00; B82Y 20/00; Y02E 10/50; Y02E 10/543
(Continued)

(56) References Cited

U.S. PATENT DOCUMENTS 5,500,056 A * 3/1996 Wada ................ H01L 31/02167
136/256
8,133,768 B2 3/2012 Ray et al.
(Continued)

FOREIGN PATENT DOCUMENTS

WO 2011/049933 A1 4/2011

OTHER PUBLICATIONS

Zhu et al. "Applications of carbon materials in photovoltaic solar cells". Solar energy materials & solar cells 93 (2009) 1461-1470.*
(Continued)

*Primary Examiner* — Lindsey Bernier
(74) *Attorney, Agent, or Firm* — MacMillan, Sobanski & Todd, LLC

(57) ABSTRACT

A photovoltaic cell structure is disclosed that includes a back contact layer that includes single wall carbon nanotube elements. The single wall carbon nanotube (SWNT) back contact is in electrical communication with an adjacent semiconductor layer and provides a buffer characteristic that impedes elemental metal migration from the back contact into the semiconductor active layers. In one embodiment, the SWNT back contact includes a semiconductor charac-
(Continued)

teristic and a buffer characteristic. In another embodiment, the SWNT back contact further includes a metallic characteristic.

14 Claims, 19 Drawing Sheets

Related U.S. Application Data

(60) Provisional application No. 61/682,452, filed on Aug. 13, 2012, provisional application No. 61/253,008, filed on Oct. 19, 2009.

(51) Int. Cl.
    *H01L 31/0725*     (2012.01)
    *H01L 31/076*     (2012.01)
    *B82Y 10/00*     (2011.01)
    *B82Y 20/00*     (2011.01)
    *H01L 31/0216*     (2014.01)
    *H01L 31/075*     (2012.01)
    *H01L 31/18*     (2006.01)
    *H01L 31/02*     (2006.01)
    *H01L 31/077*     (2012.01)

(52) U.S. Cl.
    CPC .. *H01L 31/02008* (2013.01); *H01L 31/02167* (2013.01); *H01L 31/022441* (2013.01); *H01L 31/073* (2013.01); *H01L 31/075* (2013.01); *H01L 31/076* (2013.01); *H01L 31/077* (2013.01); *H01L 31/0725* (2013.01); *H01L 31/1828* (2013.01); *Y02E 10/50* (2013.01); *Y02E 10/543* (2013.01); *Y02E 10/548* (2013.01)

(58) Field of Classification Search
    USPC ................ 136/252, 255, 256, 260, 264, 265
    See application file for complete search history.

(56) References Cited

U.S. PATENT DOCUMENTS

| | | | |
|---|---|---|---|
| 8,431,818 B2 | 4/2013 | Flood | |
| 2007/0111368 A1* | 5/2007 | Zhang | B82Y 10/00 438/99 |
| 2008/0276987 A1* | 11/2008 | Flood | H01L 31/035281 136/256 |
| 2010/0313951 A1 | 12/2010 | Nalamasu et al. | |
| 2011/0214728 A1* | 9/2011 | Veerasamy | B82Y 10/00 136/256 |
| 2012/0000525 A1 | 1/2012 | Flood | |
| 2013/0157402 A1 | 6/2013 | Jin et al. | |

OTHER PUBLICATIONS

European Extended Search Report, Application No. 13829761.9 dated Jun. 2, 2016.
European Office Action, Application No. 13829761.9, dated Aug. 22, 2017.

* cited by examiner

|  | $V_{oc}$ Volts | $J_{Sc}$ mA/cm$^2$ | Fill Factor % | Efficiency % | Series Resistance $\Omega$-cm$^2$ | |
|---|---|---|---|---|---|---|
| Au | 0.665 | 19.58 | 62.04 | 7.80 | 7.80 | as prepared |
| Cu-Au | 0.757 | 19.52 | 69.00 | 10.20 | 10.20 | |
| SWNT | 0.778 | 20.07 | 39.15 | 6.15 | 6.15 | |
| SWNT-Au | 0.746 | 21.12 | 66.05 | 10.40 | 10.40 | |
| Au | 0.499 | 19.73 | 60.34 | 3.93 | 3.93 | samples heated 300 °C for 10 mi under Ar flow |
| Cu-Au | 0.696 | 17.64 | 63.83 | 7.83 | 7.83 | |
| SWNT | 0.783 | 14.00 | 28.45 | 3.12 | 3.12 | |
| SWNT-Au | 0.773 | 21.15 | 67.21 | 10.99 | 10.99 | |

FIG. 15

BACK CONTACT LAYER FOR PHOTOVOLTAIC CELLS

CROSS-REFERENCE TO RELATED APPLICATIONS

This application is the National Phase of International Application PCT/US2013/054783 filed Aug. 13, 2013 which designated the U.S. and that International Application was published in English under PCT Article 21(2) on Feb. 20, 2014 as International Publication Number WO 2014/028526. PCT/US2013/054783 claims the benefit of U.S. Provisional Application No. 61/682,452, filed Aug. 13, 2012. This application is also a Continuation-In-Part of U.S. patent application Ser. No. 13/515,686, filed Aug. 1, 2012, which is the National Phase of International Application PCT/US2010/053167 filed Oct. 19, 2010 which designated the U.S. and that International Application was published in English under PCT Article 21(2) on Apr. 28, 2011 as International Publication Number WO/2011/049933. International Application PCT/US2010/053167 claims the benefit of U.S. Provisional Application No. 61/253,008, filed Oct. 19, 2009. Thus, the subject nonprovisional application claims priority to U.S. Provisional Application No. 61/253,008, filed Oct. 19, 2009. The disclosures of these applications are incorporated herein by reference in their entirety.

STATEMENT REGARDING SPONSORED RESEARCH

This invention was made with government support under Grant Number DE-SC0006349, awarded by the Department of Energy. The government has certain rights in the invention.

FIELD OF THE INVENTION

This invention is generally directed to photovoltaic (PV) cells and, in particular, to Cadmium Telluride based PV cells and the layered structure thereof. This invention relates to improved electrical contact structures for CdTe-based PV cells. More specifically, this invention relates to a carbon nanotube layer that contacts and forms an ohmic contact to a semiconducting layer for use in a semiconducting device, such as a photovoltaic solar cell.

BACKGROUND OF THE INVENTION

There is no admission that the background art disclosed in this section legally constitutes prior art.

It is well known that solar cells or photovoltaic cells (PV cells) can be used to convert solar energy into current and voltage, or electric energy. Typical photovoltaic cells include a substrate and two ohmic contacts (i.e., electrode layers) for passing current to an external electrical circuit. The cell also includes an active semiconductor junction, usually comprised of two or three semiconductor layers in series. The two-layer type of semiconductor cell consists of an n-type layer and a p-type layer. The three-layer type includes an intrinsic (i-type) layer positioned between the n-type layer and the p-type layer for absorption of light radiation. The photovoltaic cells operate by having readily excitable electrons that can be energized by solar energy to higher energy levels, thereby creating positively charged holes and negatively charged electrons at the interface of various semiconductor layers. The creation of these positive and negative charge carriers creates a net voltage across the two electrode layers in the photovoltaic cell, and establishes a current of electricity.

In order to improve the performance of photovoltaic cells, it is advantageous to decrease the thickness of the various protective and active layers to reduce materials usage and weight, improve mechanical flexibility, and improve light transmissibility into and through the structure. Thin-layer and ultra-thin-layer photovoltaic cells utilize thin-layer semiconductor materials to form the various active layers of the cells. These thin layer semiconductor materials offer several distinct advantages over thicker crystalline materials, insofar as they can be easily and economically fabricated into a variety of devices by mass production processes.

As the thickness of the various functional layers decreases, the impact of defects within the layer structures and at the layer junction interfaces becomes more pronounced. One such defect is the presence of current-shunting, short circuit defects. These defects seriously impair the performance of the photovoltaic devices fabricated from thin layer semiconductor materials and also detrimentally affect production yield. These process-related defects are thought to either be present in the morphology of the substrate electrode, or develop during the deposition or subsequent processing of the semiconductor layers.

Shunt defects are present in photovoltaic devices when one or more low resistance current paths develop through the semiconductor body of the device, allowing current to pass unimpeded between the electrodes thereof. Under operating conditions, a photovoltaic device in which a shunt defect has developed, exhibits either (1) a low power output, since electrical current collected at the electrodes flows through the defect region (the path of least resistance) in preference to an external load, or (2) complete failure where sufficient current is shunted through the defect region to "short out" the device.

In certain instances, barrier layers may provide passivation of shunt defects. U.S. Pat. No. 4,251,286 to Barnett shows PV cells having n- and p-layers made from copper sulfide and cadmium sulfide forming a heterojunction interface. In one embodiment, the PV cells may include a blocking layer (16) of zinc sulfide formed between the collector p-layer (12) and the back contact (14). In another embodiment, the blocking layer may be a localized cadmium sulfate layer (17) disposed on the exposed portions of the cadmium sulfide active layer.

U.S. Pat. No. 4,598,306 to Nath et al. shows barrier layers formed from oxides, nitrides and carbides of indium, tin, cadmium, zinc, antimony, silicon, and chromium. These barrier layers are transparent and preferably applied between a transparent electrode and the semiconductor body. Such barrier layers were applied to amorphous silicon p-i-n-PV cells having a stainless steel back contact.

U.S. Pat. No. 7,098,058 to Karpov et al. discloses a method of applying a bonding material onto a semiconductor layer having electrical non-uniformities. The formed semiconductor layers of a photovoltaic cell are immersed into a solution of the bonding material and an electrolyte. The semiconductor layers are energized by way of light energy causing an electrical potential within the semiconductor layers. The bonding material is carried to the semiconductor surface by an electrochemical reaction that causes a redistribution of the positive and negative ions of an electrolyte solution. The bonding material becomes selectively applied to areas of aberrant electric potential by way of the energized semiconductor layers.

Electronic transport across a junction of two materials, one of which is a semiconductor, is governed by the alignment of the band structure and the chemical potential of the two materials. Proper alignment results in a good ohmic contact across the junction, while misalignment can result in a potential barrier that must be overcome for the transport of electrons to occur. For semiconductor devices, good ohmic contacts are important to minimize losses in the device and/or across the junction. The degradation of the junction can be a result of chemical instability that may be accelerated by thermal heating from the ambient environment and/or internal device heating, the latter of which may be caused by the loss of energy required to overcome the potential barrier formed at the non-ohmic contact.

A common material for thin layer PV devices is p-type cadmium telluride (CdTe) because it has a bandgap ideally suited for solar absorption and energy conversion. Traditionally, the work function of the metal contact is matched to the semiconducting layer such that no potential barrier exists, allowing the charges to flow freely. However, p-CdTe has a high work function, which limits the materials that can be used to make a back contact with it. Most metals have a lower work function than CdTe and, as a result, will form a Schottky junction between the metal and CdTe layers. This decreases the energy conversion efficiency of the CdTe devices.

To avoid this problem, many researchers and CdTe panel manufacturers apply copper (Cu) to the CdTe layer to form a $Cu_xTe$ layer that can be contacted by metals such as gold, aluminum, and chromium. Ohmic contacts have been formed using graphite pastes and inks in combination with the copper layers. Single wall carbon nanotube (SWNT) layers have been used previously as a back contact for CdTe devices. However, Cu is always utilized to form a $Cu_xTe$ layer. The application of copper is often preceded by an etching of the CdTe to produce a Te-rich layer to form $Cu_xTe$. A tellurium-rich layer may also be formed at the back contact as a result of a preceding process, such as a negative photoresist step or another step used to passivate pin-holes.

Unfortunately, Cu has the potential to degrade the performance of the CdTe device. Studies have shown that Cu can diffuse through the CdTe at the grain boundaries at moderate temperatures, under illumination, when excess Cu is applied. Cu throughout the CdTe layer can result in a lower shunt resistance, which can lead to a decreased fill factor and lower energy conversion efficiency. Furthermore, Cu can diffuse completely through the CdTe layer and to the p/n-junction into the window layer (typically formed from CdS) of the device. In addition to the problems that arise from Cu in the CdTe layer, when Cu reaches and diffuses into the CdS layer, the $V_{OC}$ may decrease, thereby reducing the energy conversion efficiency even further.

In addition to applying barrier layers to prevent or slow Cu migration, eliminating Cu contact materials altogether have been attempted. One substitute for Cu is to use high work function metal oxides (such as $MoO_3$) to contact the CdTe layer. A thin layer of $MoO_x$/nickel (Ni) has been used to make a back contact to a CdTe device and has resulted in PV properties that are similar to a standard CdTe device with Cu/Ni. The $MoO_x$/Ni finished device was also able to withstand 19 hours of thermal and illumination stress with minimal degradation. However, the non-stoichiometric $MoO_x$ layer is an insulator and, thus, the thickness needs to be well controlled to achieve the ohmic contact with the CdTe but avoid the additional series resistance of a thicker layer.

Thus, it would be desirable to provide a buffer or barrier layer that is compatible with CdS/CdTe flexible, thin layer PV cells that is effective for CdTe layers of about 0.5 microns or less and convenient to apply. It would be further desirable to provide a structure and method for an ohmic contact to a semiconducting layer for use in a semiconducting device, such as a photovoltaic solar cell, that avoids the use of Cu in direct contact with a semiconductor layer that is sensitive to Cu absorption and migration, as well as the other issues mentioned above.

SUMMARY OF THE INVENTION

The invention relates generally to photovoltaic cells and methods of fabrication. More particularly, the invention relates to a photovoltaic cell having an ohmic contact structure that blocks or eliminates copper diffusion into subsequent semiconductor layers. This invention further relates to a method of manufacturing photovoltaic cell having such an ohmic contact structure.

In a first aspect of the invention, a photovoltaic cell is formed in a superstrate configuration and includes a substrate layer, a transparent conductive contact layer, and a semiconductor. The semiconductor layer may include active layers formed from any suitable semiconductor material, for example, such as CdS, CdTe, CIGS, CZTS, zinc phosphide, and the like. In a particular embodiment, the semiconductor layer includes a cadmium sulfide (CdS) layer having an n-type conductivity characteristic and a cadmium telluride (CdTe) layer having a p-type conductivity characteristic. Single wall carbon nanotubes (SWNTs) are arranged to form a back contact in electrical communication with the CdTe semiconductor layer. The SWNT back contact has a characteristic defined by a low potential energy barrier to electrical current flow. The SWNT back contact may be directly connected to the CdTe semiconducting layer or may be indirectly contacted thereto by way of an intermediate material, such as a metallic layer. In another embodiment, the SWNT back contact may be a sparse coating and may additionally be contained at least partially within an insulating matrix.

In yet another aspect of the invention, the photovoltaic cell having CdS and CdTe semiconductor layers is arranged such that one side of the SWNT layer forms electrical contact junctions with the CdTe layer, and the other side of the SWNT layer is in electrical communication with a metallic layer or contact. The SWNT layer is configured to inhibit or preclude the migration of deleterious elements or species into the CdTe. The metallic layer includes a metal that may be one of Au, Mo, Ti, Cr, Al. In one aspect, the metal may be a 20-50 nm thickness overcoat of Au. The metal may further be other metals or an additional semiconductor material.

In yet another aspect of the invention, a photovoltaic cell having active semiconductor layers formed from at least one of CdS, CdTe, CIGS, CZTS, and zinc phosphide includes a back contact comprising SWNTs that may be substantially filled or integrated with another material. In one embodiment, the material may include additional elements, materials, or chemical species that improved conductivity and/or the doping level in the layer. In another embodiment of the photovoltaic cell above, the SWNT layer may include predominantly semiconductor SWNTs (s-SWNTs), predominantly metallic SWNTs (m-SWNTs), or both s-SWNTs and m-SWNTs. In a particular aspect, the SWNT layer has a thickness between 1 nm and 500 nm. In another particular aspect, the SWNT layer is thin enough to be used as a light passing window. Such a SWNT layer may be sufficiently thin to allow the photovoltaic cell to be part of a tandem photovoltaic device structure. In an aspect of the invention, the SWNT layer is configured to serve as a tunneling connection between photovoltaic devices in a tandem structure. In one aspect, the SWNT layer obviates the need for use of metallic species such as Cu to prepare the CdTe back surface in order to make a low barrier back contact. In another aspect, at least a fraction of SWNTs in the layer span from one side of the layer to the other.

Various aspects of this invention will become apparent to those skilled in the art from the following detailed description of the preferred embodiment, when read in light of the accompanying drawings.

BRIEF DESCRIPTION OF THE DRAWINGS

FIG. 12b is a plot of $J_0$ vs. 1/kT plots for a SWNT/Au back contact device, similar to FIG. 12a.

FIG. 15 is a table of average J/V parameters for 18 CdTe devices before and after heating.

DETAILED DESCRIPTION OF THE PREFERRED EMBODIMENT

Figure 1:
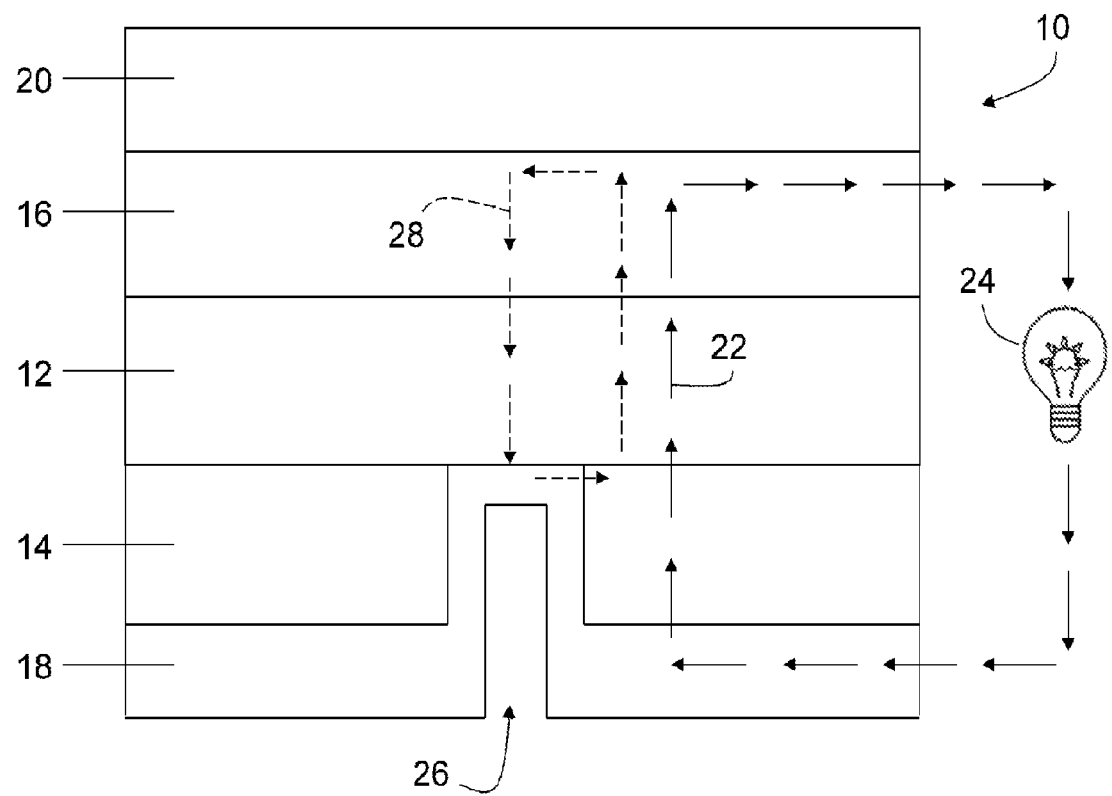
FIG. 1 is a schematic view of a prior art photovoltaic cell showing current flow in a closed circuit pathway and a shunted circuit pathway.

Referring now to the drawings, there is illustrated in FIG. 1 a prior art photovoltaic (PV) cell, shown generally at 10, having two active semiconductor layers: an n-type layer formed of cadmium sulfide (CdS) 12, and a p-type layer formed of cadmium telluride (CdTe) 14. These semiconductor layers are connected between a transparent conductive oxide (TCO) front electrode 16 and a back contact (back electrode) 18. A protective transparent substrate (or superstrate) 20, e.g., glass or polymer layer, forms the outermost layer. When exposed to sunlight, the PV cell produces an electrical output, shown schematically as current flow 22, that powers an external load 24.

There is also illustrated schematically in FIG. 1, a structural non-uniformity or electrical defect, such as a pinhole occurring in the p-type semiconductor layer 14, which is one example of an electrical shunt 26. During the metallization process, the back contact may partially fill the pinhole bridging the internal electrical pathway and causing the shunt 26. The shunt 26 provides a low resistance path between the front and back electrodes, as illustrated by a short-circuited current path 28. Various other structural non-uniformities or defects may exist throughout portions of the semiconductor layers. They may occur for numerous reasons, and can include defects caused by the deposition process used to form the semiconductor layers or defects caused by morphological irregularities in the deposition surface of the substrate layer. The resulting short-circuit connection or shunt 26 allows electrical current to flow directly through the PV cell, as shown by the short-circuit current path 28, thus bypassing the working load 24 such as a motor or a light.

While not illustrated, other defects may also form shunts 26. Some examples include projections extending from one active layer to one contact or craters that reduce the material thickness of the active layers between the electrodes. Other electrical anomalies may also include weak diodes which are areas of the PV cell structure that exhibit forward current leakage paths. Materials, such as dopants used to form the various layers of the PV cell, may also diffuse through the cell layers and inhibit electrical output of the cell 10. In addition, PV cells have intentional discontinuities such as scribe lines, which are areas of separation within a layer, intentionally created, to electrically separate contiguous cells within a cell array.

Figure 2:
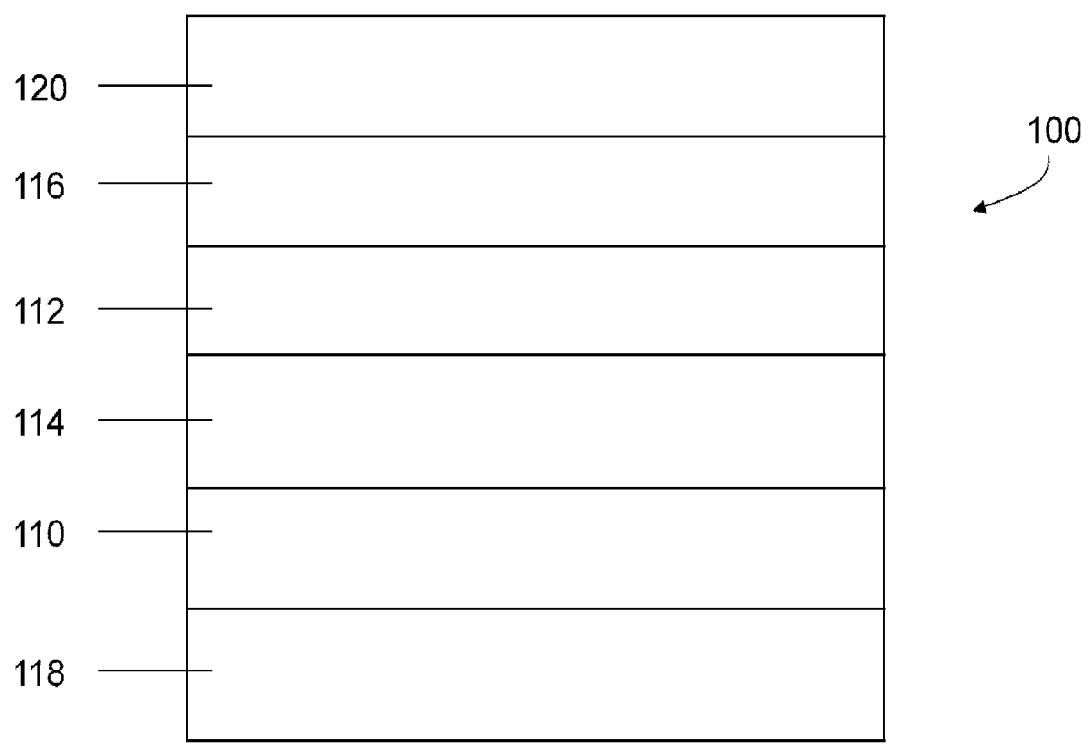
FIG. 2 is a schematic view of an embodiment of a photovoltaic cell having a buffer layer.

Referring now to FIG. 2, there is illustrated one embodiment of a CdS/CdTe PV cell, shown generally at 100 having a buffer layer 110. In one embodiment of the PV cell 100, the buffer layer is configured as a CdS buffer layer 110. The PV cell 100 includes a substrate layer 120, which may alternatively be configured as a superstrate layer depending on the formation sequence of the other layers or the orientation of the PV cell 100 relative to the overhead sun when it is used. The substrate layer 120 may be formed from a transparent polymer such as, for example, polyimide, a glass material such as, for example, soda-lime glass, or any other suitable material through which light may pass. A TCO front contact 116 is formed next to the substrate layer 120. The TCO layer 116 may be, for example, a zinc oxide (ZnO) layer or any other transparent material capable of forming part of the PV cell electric circuit. Active semiconductor layers, such as an n-type layer 112 and a p-type layer 114 are in electrical communication with the TCO layer 116 and a back contact layer 118. In the embodiment shown in FIG. 2, the semiconductor layers are an n-type CdS layer 112 and a p-type CdTe layer 114. Alternatively, other materials or alloys, such as Group II-VI alloys, may be used to form the semiconductor layers. Though not shown, an intrinsic (i.e., i-type) layer may be deposited between the n-type and p-type layers, forming a p-i-n semiconductor configuration which may include an intrinsic layer of either CdS or CdTe. Alternatively, the semiconductor layers may be a plurality of interconnected p-n or p-i-n semiconductor layers. Additionally, the semiconductors layers may be arranged as n-p or n-i-p layers. In one non-limiting example, the CdS buffer layer 110 is formed between the back contact 118 and the CdTe p-layer 114 in a multilayer CdTe-based solar cell.

Figure 3:
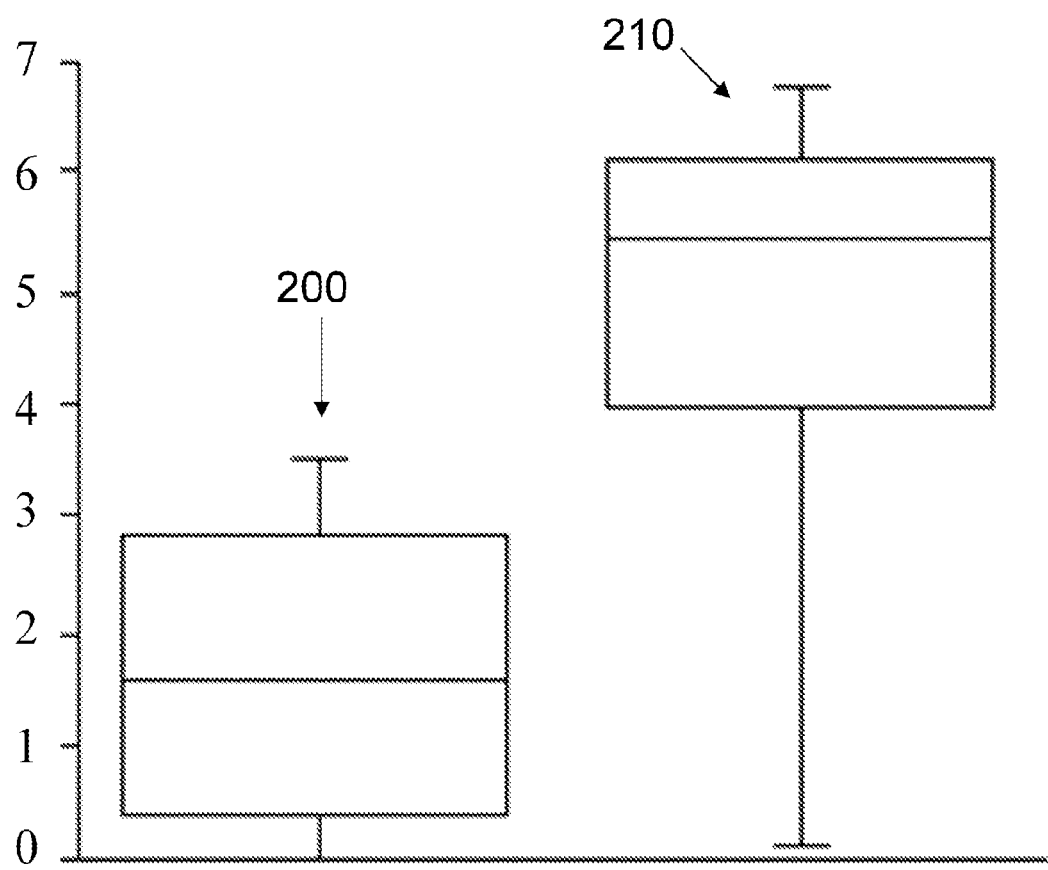
FIG. 3 is a comparative box-and-whisker plot of conversion efficiencies for 35 PV cells with and without a buffer layer, where the CdTe layer thickness is about 0.3 μm.

As shown in FIG. 3, there are illustrated box-and-whisker plots of conversion efficiencies of cells with and without the CdS back buffer layer 110. The box-and-whisker plot 200 illustrates the conversion efficiency (Y-axis, expressed as percentage) of a standard PV cell, similar to the PV cell 10 of FIG. 1 without the shunt 26. The box-and-whisker plot 210 is a comparative efficiency plot of the PV cell 100. Data generated from tests of the above-described CdS/CdTe p-n PV cell embodiment, similar to the embodiment of FIG. 2, shows a substantial increase in conversion efficiency of a thin-layer PV device having the CdS buffer layer 110. This buffer layer 110 is also effective for ultra-thin layer PV devices. In the embodiment of the PV cell 100 used to develop the plots shown in FIGS. 3-5, the CdTe layer 114 is approximately 0.3 microns (μm). The thickness of the CdTe layer 114, however, may be 0.5 μm or less.

Figure 4:
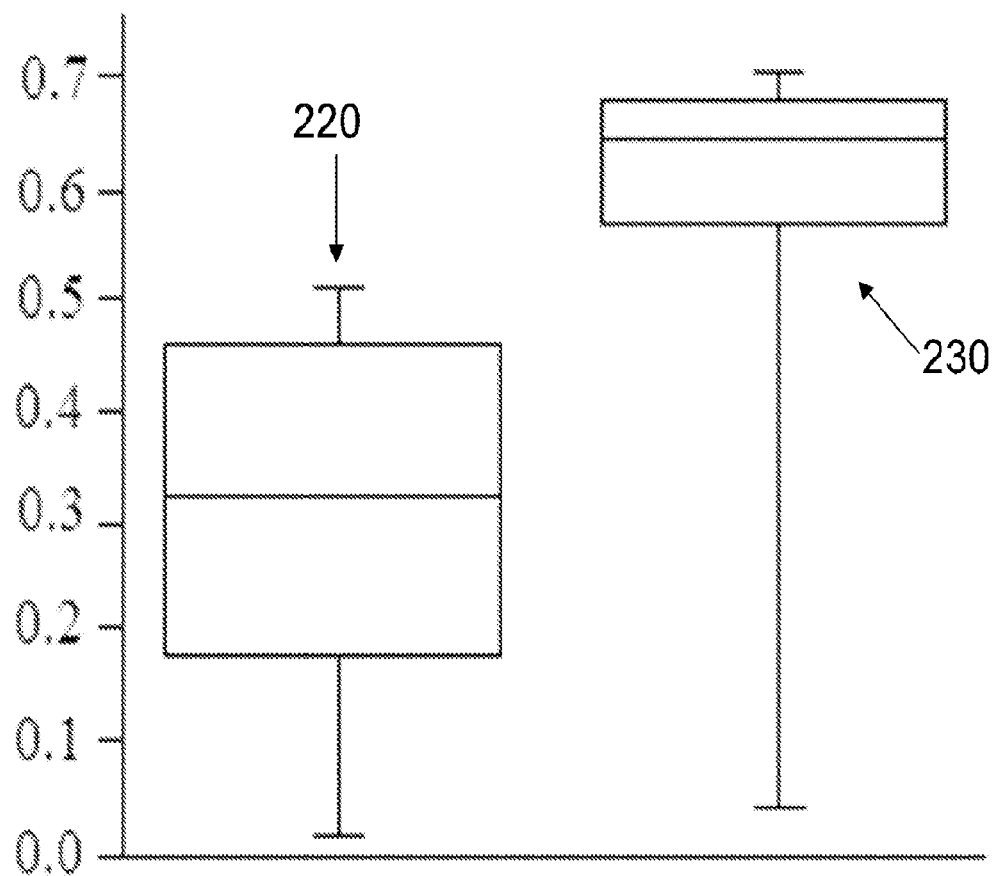
FIG. 4 is a comparative box-and-whisker plot of open-circuit voltage measurements for PV cells with and without a buffer layer, where the CdTe layer thickness is about 0.3 μm.
Figure 5:
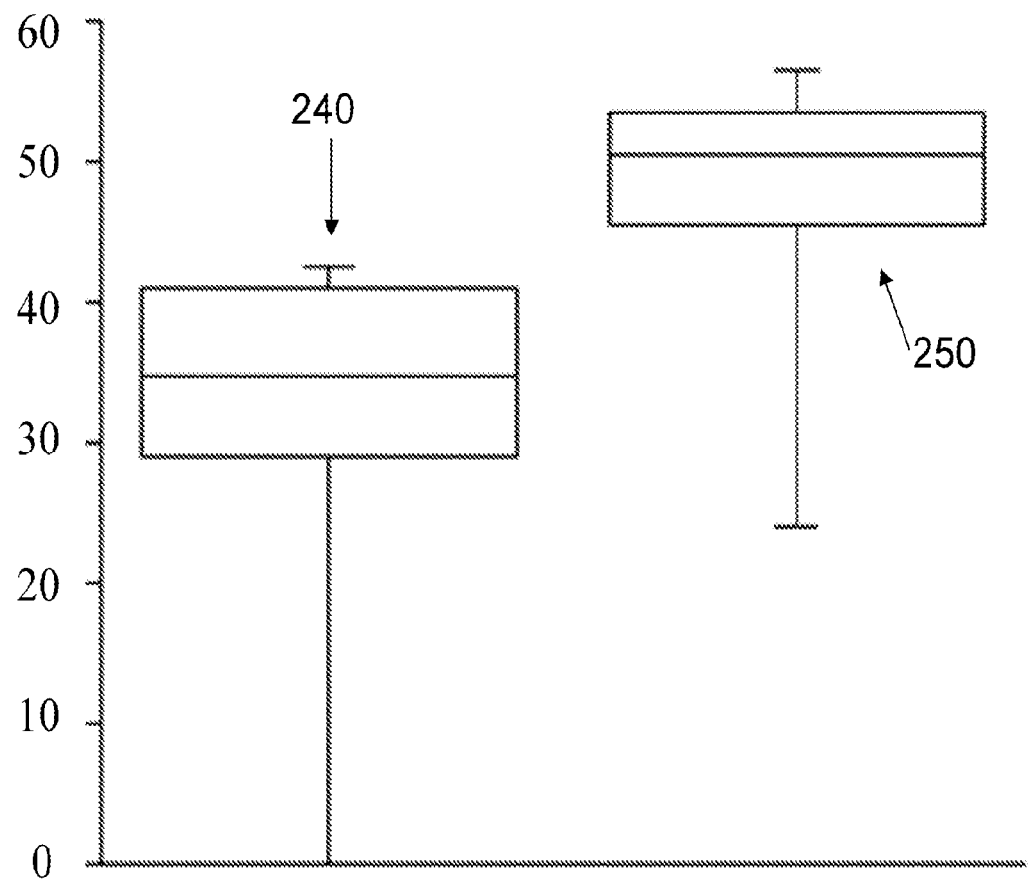
FIG. 5 is a comparative box-and-whisker plot of fill factor measurements for PV cells with and without a buffer layer, where the CdTe layer thickness is about 0.3 μm.

The addition of the CdS buffer layer 110, as shown in the box-and-whisker plots of FIGS. 3-5, has particular advantages in efficiency and yield of the solar cells. Referring now to FIG. 4, there is illustrated a comparative plot of open circuit voltages (Y-axis, expressed in volts) for the PV cell 10 and the buffered PV cell 100. As referred to in describing the comparative box-and-whisker plots, the PV cell 10 was constructed without an electrical defect, as shown in FIG. 1. The plot 220 shows a lower range of open circuit voltage for the conventional PV cell 10. The plot 230 illustrates the improvement made by the addition of the back buffer layer 110 in the buffered PV cell 100. As can be seen from the comparative plots 220 and 230, the PV cell 100 exhibits a more consistent and higher value for open circuit voltage as shown by the higher and narrower box portion of the plot 230. As shown in FIG. 5, the fill factor (Y-axis, expressed as percentage) of the PV cell 10, shown as plot 240, exhibits a lower fill factor percentage than shown by plot 250 representing the PV cell 100.

The presence of the CdS buffer layer 110 allows the PV cell 100 to be made with a thinner CdTe p-type layer 114 than has been generally possible on prior PV cells, such as PV cell 10. In certain embodiments, an ultra-thin CdTe layer may be on the order of 0.5 micron (500 nm) or less in thickness. Additionally, thickness ranges outside of those for the ultra thin CdTe layer may also be similarly benefited. The data, plotted in FIGS. 3-5, was generated with PV cells having a p-type CdTe layer 14 and 114 of approximately 0.3 microns in thickness. These box-and-whisker plots illustrate three important figures of merit (efficiency, open circuit voltage, and fill-factor) for ensembles of 35 small-area cells. (The box and whisker plots indicate the median value as the interior line, the top and bottom of the box indicates the 75% and 25% percentile, and the extremes show the 95% and 5% percentiles.) As shown in FIGS. 3-5, the shunt-passivation properties of the CdS buffer layer 110 provide increased conversion efficiencies, increased open-circuit voltage, and increased percentage of fill-factor.

Figure 6:
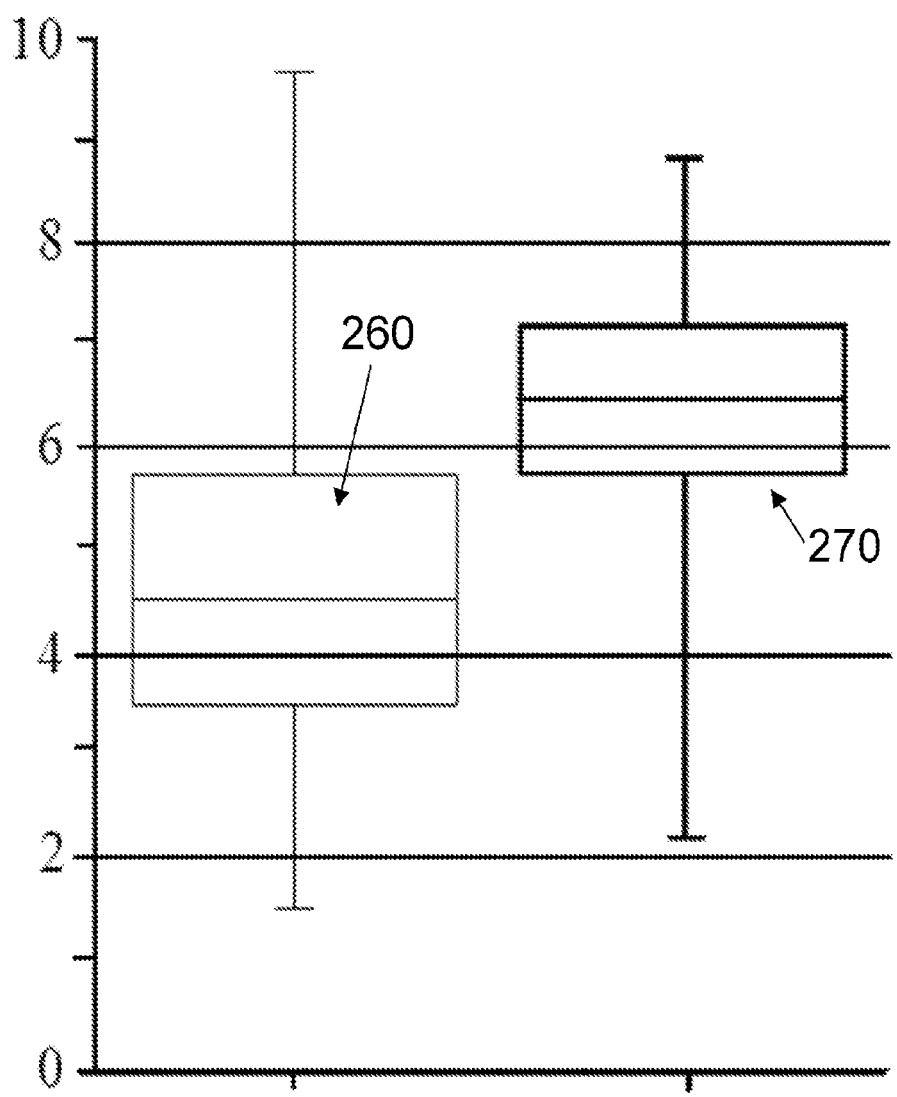
FIG. 6 is a comparative box-and-whisker plot of % Efficiency for a CdS/CdTe PV cell and a CdS/CdTe/CdS cell formed using manufacturing parameters defined by a first embodiment, each having a CdTe layer thickness of 0.5 μm.
Figure 7:
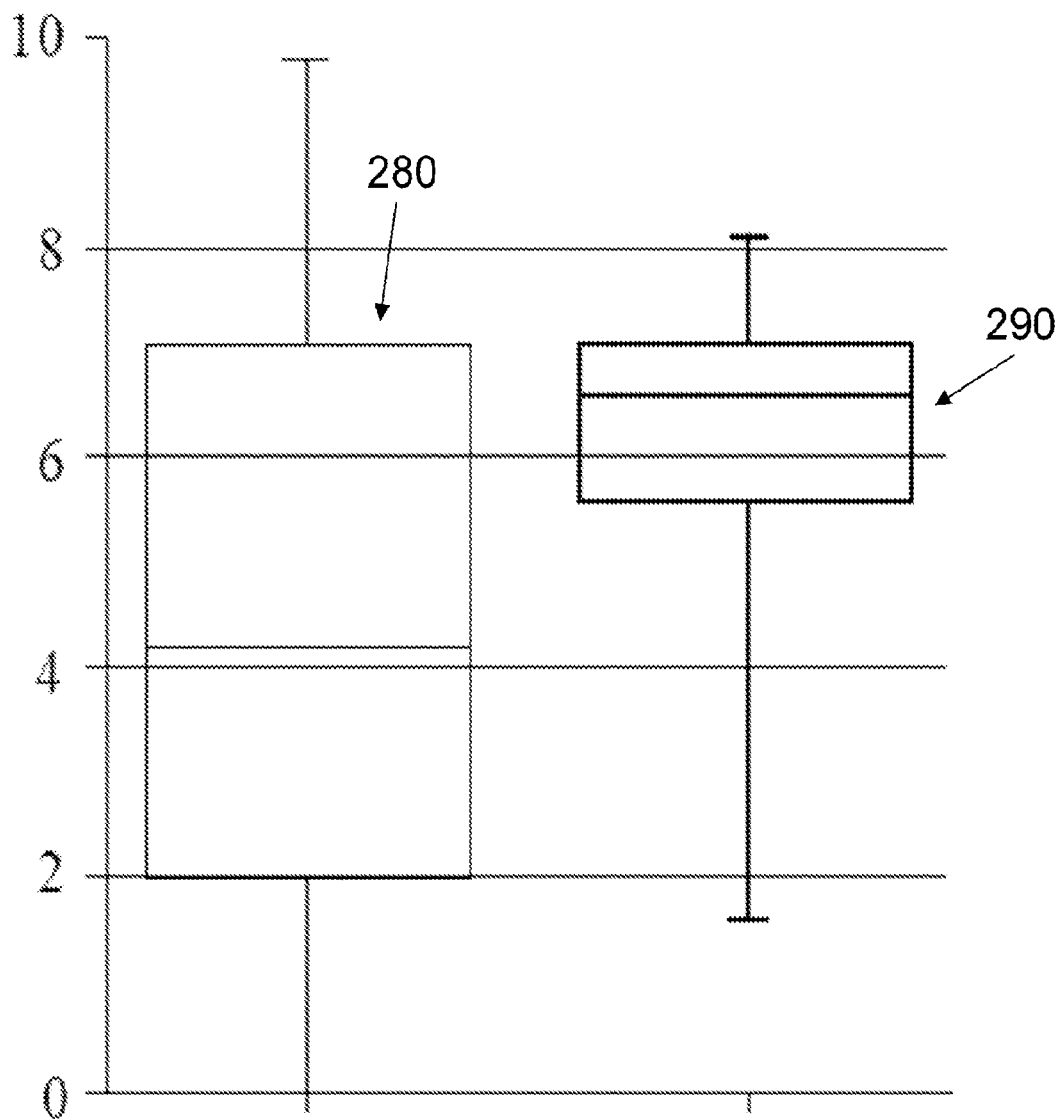
FIG. 7 is a comparative box-and-whisker plot of % Efficiency for a CdS/CdTe PV cell and a CdS/CdTe/CdS cell formed using manufacturing parameters defined by a second embodiment, each having a CdTe layer thickness of 0.5 μm.

Referring now to the box-and-whisker plots of FIGS. 6 and 7, there are illustrated comparative efficiency plots of conventional PV cells, similar to the PV cell 10, and CdS buffered PV cells, similar to the PV cell 100. The data, plotted in FIGS. 6 and 7, was generated from PV cells having a CdTe p-type layer thickness of approximately 0.5 microns. As shown in FIG. 6, the plot 270 of efficiency of the buffered PV cell 100 shows the average efficiency to be higher by about 2% absolute and the variation of efficiency is smaller than for PV cell 10. PV cell 10 differs from PV cell 100 in that a back buffer layer 110 of FIG. 2 has been added to the structure of FIG. 1. In one embodiment of the PV cell 100, buffer layer 110 consists of a sputtered CdS layer.

It is to be understood that, in PV cells, CdS is used as an n-type semiconductor layer. As such, applying another layer formed from an n-type material, such as CdS, to create a n-type CdS/p-type CdTe/n-type CdS cell structure would normally be highly unfavorable for solar cell operation. The inventors herein have discovered that the insertion of a CdS buffer layer results in remarkably improved cell performance. While not wishing to be bound by theory, the inventors believe that the improvements in PV cells may be due, in part, to an altered property of the CdS buffer layer 110. The CdS back buffer layer 110, unlike the front CdS active layer 112, changes its conductivity type to intrinsic or slightly p-type during the post-deposition steps of the fabrication process. The resulting CdS buffer layer 110 serves as a buffer/passivation layer at CdTe/Back contact interface.

While not wishing to be bound by theory, the inventors now believe that the presence of the back contact 118 may also influence the change in conductivity of the CdS buffer layer 110 to intrinsic or slightly p-type during the post-deposition steps of the fabrication process. In one embodiment of the PV cell 100, the back contact 118 can be made from or include, for example, elemental forms of one or more of copper, silver, gold, titanium, carbon and molybdenum. In another embodiment, the back contact 118 may be made from any suitable conductive material, which may be doped or alloyed with, for example, elemental constituent forms of one or more of copper (Cu), silver (Ag), gold (Au), titanium (Ti), carbon (C), and molybdenum (Mo). In one embodiment, the carbon material may be a carbon nanotube material. In general, these elements may include Group I elements of the Periodic Table which, when substituted for the Group II element, i.e., cadmium (Cd) in the CdS, will tend to compensate the natural n-type activity of the adjacent CdS blocking layer. In the alternative or additionally, Group V elements may be substituted for the Group VI element, i.e., sulfur (S) in the CdS, will also tend to compensate the natural n-type activity of the adjacent CdS blocking layer. In a broad aspect of the invention, the conductive material of the back contact 118 may be characterized by those materials exhibiting a high work function. The work function of the conductive material may be generally defined as the energy required to remove an electron from just below the surface of a substance into the vacuum space. The work function may be characterized by the energy used to liberate the electrons such as, for example, a photoelectric work function using photon energy, a thermionic work function using heat energy, and a field electron emission using an electric field. The value of work function for generally applicable conductive elements may be in the general range of approximately 4.5 to 5.5 eV. Some applicable materials, such as for example titanium (Ti), may be slightly outside of the lower end of this range.

While further not wishing to be bound by theory, the inventors believe that certain constituents in the back contact 118 such as Cu 300, for example, diffuse or otherwise migrate into the CdS buffer layer 110. The copper 300 exhibits a strong affinity for CdS and causes the CdS layer to lose its n-type conductivity. The Cu 300 may change the conductivity of the CdS buffer layer 110 to an intrinsic (i-type) layer or a slightly p-type layer.

Figure 8:
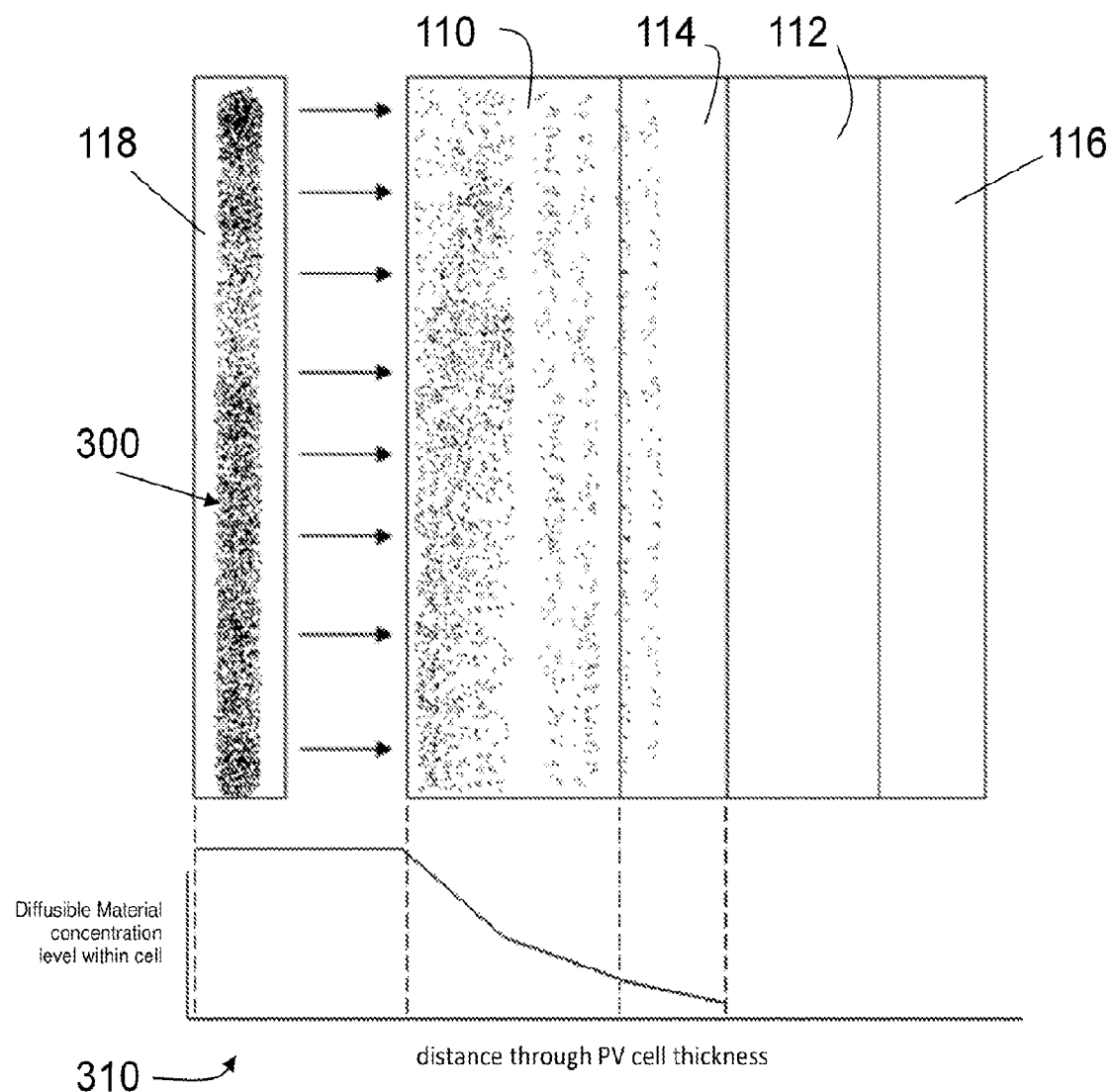
FIG. 8 is a schematic representation of a concentration gradient of material diffused through the thickness of an embodiment of a PV cell.

As a continuing expression of non-binding theory, the inventors believe that the Cu 300 diffuses through the CdS buffer layer 110 exhibiting a concentration gradient, shown generally at 310 that is greater near the source of Cu 300. FIG. 8 illustrates a schematic representation of one such concentration gradient 310 across the CdS buffer layer 110. Other concentration gradients of Cu 300 or other appropriate conductivity killing materials may be used. In one embodiment, the gradient 310 is generally isolated to CdS buffer layer 110. In another embodiment, the concentration gradient 310 of Cu 300 diffuses through the CdS buffer layer 110 and further diffuses through a portion of the CdTe p-type layer 114, terminating prior to reaching the CdS n-type layer 112. The diffusion of Cu 300 can occur during the manufacturing process or after assembly and may be further based on exposure to elevated temperatures. In one embodiment, the Cu source 300 is the back contact 118. In another embodiment, the Cu 300 is applied as either a coating on the back contact 118 or a dopant applied to the CdS buffer layer 110. In one embodiment, the diffusible Cu material 300 may alternatively be silver, gold, molybdenum, titanium, or carbon. In yet another embodiment, a thermal energy input, from any suitable source, may be provided on the order of 150° C. to facilitate diffusion of the diffusible material 300 into the buffer layer 110.

In another embodiment, the CdS buffer layer 110 may be produced in a stoichiometric proportion of cadmium and sulfur. Such a proportion causes the CdS buffer layer 110 to exhibit an insulating characteristic consistent with an intrinsic (i-type) layer. This stoichiometric composition of the buffer layer may be contrasted with the slightly sulfur-deficient nature of the CdS n-type semiconductor layer 112. Such n-type behavior in CdS may also be produced by doping with a Group III element such as indium or with a Group VII element such a chlorine. The advantage of a high resistivity CdS buffer layer 110 is the ability to reduce the thickness of the CdTe layer 114, while maintaining high PV cell performance. This reduction in thickness of the CdTe layer has many benefits. Reduction in the CdTe layer thickness reduces the amount of tellurium thus lowering manufacturing costs due to the expense of tellurium, which is a rare element. A thinner CdTe layer 114 reduces the amount of cadmium which reduces fabrication costs and reduces the potential for heavy metal pollution. Another benefit is the improved transparency of the thinner CdTe layer 114.

In certain embodiments, improved transparency through a thinner CdTe layer 114 permits more light wavelengths to pass through to lower layers, such as those in double and triple junction cells. The improved transparency allows the PV coating to be semi-transparent, which is useful for window applications. Additionally, the thin PV layers allow the use of a back reflector that permits more light to be directed back through the cell for subsequent electron excitation, which improves efficiency. As a frame of reference, known PV cells have been constructed with CdTe layers on the order of 2.3-3.5 microns and as high as 10 microns. By contrast, the inventors have now shown that the thickness of the CdTe layer 114, when used in conjunction with the CdS buffer layer 110 has been produced in a range of 0.5 microns and 0.3 microns and may be still further reduced.

In another embodiment of a photovoltaic cell having a CdS buffer layer, an intrinsic layer may be disposed between the n-type CdS layer 112 and the p-type CdTe layer 114, in the form of a generic n-i-p structure. A portion of such a PV cell structure may be in the form of a n-type CdS/i-type layer/p-type CdTe/CdS buffer layer. In certain embodiments, the i-type layer may be formed from a variety of materials such as, for example, an i-type CdTe layer in conjunction with the p-type CdTe layer. In another embodiment, the PV cell may be configured as n-type CdS/i-type CdTe/p-type ZnTe/CdS buffer layer.

Unlike other existing buffer layers and shunt passivation schemes, the CdS buffer layer 110 uses the same material that is already used in the cell fabrication process. Thus, the buffer layer 110, and its application onto the cell, can be performed in the same deposition chamber where the main CdS and CdTe layers are deposited. In this case no vacuum break or other steps associated with use of an additional apparatus are necessary.

The substrate material is moved to a suitable processing environment for deposition of the TCO layer 116. In one embodiment of the method of forming the PV cell 100, the TCO layer 116 is deposited by a form of sputtering such as, for example, RF sputtering, magnetron sputtering, and the like. It should be understood that any suitable application process may be used to form the TCO layer 116.

The various active semiconductor layers (CdS 112, CdTe 114, and the like) are deposited onto the TCO layer 116. In the embodiment shown in FIG. 2, the semiconductor layers are deposited as a n-CdS layer 112 and a p-CdTe layer 114. Other layers, such as an intrinsic layer or numerous stacked semiconductor layers, may be formed on the previously applied portions of the cell if desired.

In one embodiment of the method, the semiconductor layers are deposited by sputtering. The semiconductor layers are sputter deposited within an evacuated sputtering chamber that contains a target source of CdS and a target source of CdTe.

Once the semiconductor layers have been formed, a CdS buffer layer 110 is applied onto the CdTe layer 114. In certain embodiments, the CdS buffer layer 110 can have a thickness that ranges from about 30 nm to about 50 nm. In one embodiment, the CdS buffer layer 110 is deposited by sputtering. In yet another embodiment, the CdS buffer layer 110 is sputter deposited onto the CdTe layer 114 within the same sputtering deposition chamber and using the same CdS target source. In yet another embodiment, the CdS buffer layer 110 is deposited within the same sputtering chamber but using a different sputtering source. In yet another embodiment, the CdS buffer layer 110 is deposited in a different chamber using sputtering, evaporation, chemical bath deposition, or other suitable method for depositing the CdS.

The back CdS buffer layer 110 is deposited with similar deposition parameters that are used for the front CdS layer 112. For example, in one embodiment of the deposition process, the parameters may comprise 35 W of RF (radio frequency, 13.56 MHz) power, 18 mTorr Ar sputter gas pressure, and 250° C. substrate temperature. Alternatively, other deposition parameters may be used such as, for example, 20 W of RF power, 18 mTorr Ar gas pressure. Alternatively, the power and pressure levels may further be changed to 40 W of RF power and 9nTorr Ar gas pressure. In one embodiment of the PV cell 100 having the back contact buffer layer 110, the ultra-thin (less that 0.5 micron CdTe) cells may have an optimum thickness of the back CdS buffer layer 110 in the range of 30 nm to 50 nm. While not wishing to be bound by any particular theory, the inventors have found that the optimum CdS thickness depends on the thickness of the absorber (CdTe) layer and whether the back CdS buffer layer 110 is deposited prior to or after a $CdCl_2$ annealing treatment. In one embodiment, the $CdCl_2$ annealing treatment may be conducted at a temperature of approximately 400° C. In one embodiment of applying the back contact buffer layer, the back CdS buffer layer 110 is applied prior to the $CdCl_2$ treatment process. In another embodiment of a method of applying a back buffer layer, the back CdS buffer layer 110 may be applied after the $CdCl_2$ treatment.

After completion of the CdS buffer layer deposition/$CdCl_2$ treatment or $CdCl_2$ treatment/CdS buffer layer deposition sequence, the back contact 118 is applied onto the CdS buffer layer 110. The back contact 118 is electrically connected to the cell 100. The electrical connections may be formed in an offline process whereby connections are formed between selected portions of the active layers and the back contact. Alternatively, the electrical connections may be made internally (and monolithically) by scribing. In another embodiment, the CdS buffer layer 110 may be replaced with single wall carbon nanotubes (SWNTs). In yet another embodiment, the CdS buffer layer may include SWNTs within the layer. In a further embodiment, the buffer layer may comprise SWNTs and a buffering medium that prevents the migration of metallic elements to the CdTe layer. The buffering medium may be an insulating material, such as for example a glass or polymer material. The SWNTs may be arranged in any relative orientation, such as aligned or random. A back contact layer comprising SWNTs may be applied to any the previous buffer layers.

Figure 9:
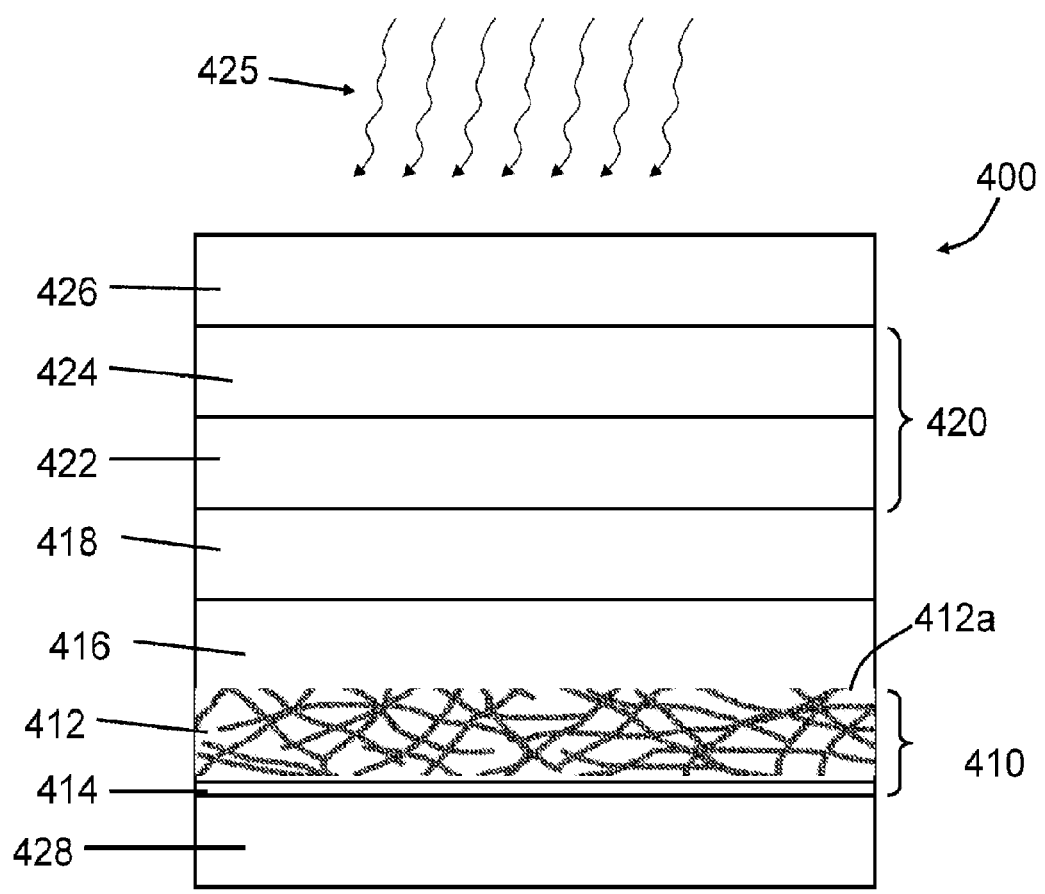
FIG. 9 is a schematic view of another embodiment of a photovoltaic cell having a buffer layer, similar to FIG. 2.

Referring now to FIG. 9, in yet another embodiment of a PV cell similar to that shown in FIG. 2, there is illustrated an embodiment of a CdS/CdTe PV cell, shown generally at 400. The PV cell 400 includes a back contact layer 410. The back contact layer 410 includes a layer of SWNTs, shown generally at 412. The SWNTs may be arranged as generally aligned vertically, horizontally, at any angle relative to a semiconductor junction. The SWNTs may alternatively be arranged randomly. The SWNTs may be may synthesized by any suitable process, such as for example, laser vaporization, arc discharge, and chemical vapor decomposition syntheses such as CoMoCat or HiPCO processes, and the like. Additionally, the other photovoltaic device layers may be prepared by deposition techniques such as sputtering, closed-space sublimation, vapor assisted transport, chemical bath deposition, electrochemical deposition, nanoparticle synthesis, or any other method not mentioned here. The thickness of the SWNT layer and the thickness of the other photovoltaic device layers may vary from being less than 1 nm in thickness to greater than several microns. In an embodiment where the SWNT layer is on the order of 1 nm or less in thickness, the layer may be sparse and incomplete and exhibit a translucence characteristic that is suitable for use in multi-cell arrangements, as will be discussed below.

The SWNT layer 412 may be comprised of semiconductor SWNTs (s-SWNTs), metallic SWNTs (m-SWNTs), or a combination of both. In one embodiment, the back contact layer 410 itself functions as a buffer layer. In another embodiment, the SWNT layer functions as the high work function metal without a propensity to migrate into the adjacent active semiconductor layer. A metallic contact layer 414, such as a Au layer, may be applied over the SWNT layer 412, on a side opposite a p-type CdTe semiconductor layer 416, to improve nanotube to nanotube electrical connectivity. Alternatively, the metallic contact layer 414 may be doped or otherwise applied onto the SWNT layer directly to improve contact with the adjacent semiconductor layer and other SWNTs. The metallic contact layer 414 may be a complete layer or may be applied at contacting or crossing points of individual SWNTs in the SWNT layer 412.

In another embodiment, the SWNT layer 412 is a layer that forms the back contact layer 410 and is the direct ohmic contact with the preceding semiconductor layer, such as the p-type CdTe layer 416 to form a SWNT/semiconductor junction 412a. The PV cell 400 may be a single PV cell or a portion of a multiple PV cell structure or part of a tandem cell arrangement. The PV cell 400 is illustrated to further include an n-type semiconductor layer 418, which will be discussed in the context of an n-type CdS semiconductor layer. The PV cell also includes a transparent conductive oxide (TCO) layer, shown generally at 420. The TCO layer 420 may be a single layer, such as an Indium Tin Oxide (ITO) layer or multiple layers, such as an intrinsic ZnO (i-ZnO) layer 322 and an aluminum doped zinc oxide (AZO) layer 424. These layers are transparent to light rays 425 that enter through an optional front window 426. The front window 426 may be, for example, glass or plastic, or a transparent encapsulation layer. A support layer 428 may be optionally applied or may be the initial layer on which the PV cell is fabricated. The support layer 428 may include glass, polymers, and/or metal foil. In one embodiment, the support layer 428 may be a front window layer to a second PV cell (not shown) that is part of a tandem cell construction. In another embodiment, the support layer 428 may be an encapsulant layer that covers all or a portion of the PV cell 400.

CdTe-based cells, generally, are difficult to couple to low resistance electrical back contacts. The difficulty appears to lie in the CdTe layer having a high electron affinity, a valence band edge that is 5.5-6 eV below the vacuum level ($E_{Vac}$), and a low p-type carrier density on the order of $10^{14}$ $cm^{-3}$. The carrier density may be within a range of $10^{14}$ $cm^{-3}$ to $10^{15}$ $cm^{-3}$. Cu is placed onto the CdTe surface to promote good electrical contact. As previously stated, however, Cu is known to diffuse through the p-type CdTe absorber to the n-type CdS window layer and produce junction-shunting pathways. Because of this diffusion, the efficiency of commercial CdTe modules slowly degrades over time.

The inventors have found that back contacts formed with pure SWNT layers showed improved open-circuit voltage ($V_{oc}$) in comparison to cells fabricated with standard Au/Cu back contacts and, once over-coated with a thin metal layer, the solar-to electric conversion efficiency was higher as well. Without wishing to be bound by theory, the results may be better understood by considering that individual semiconducting SWNTs (s-SWNTs) that span the layer connect to individual CdTe grains and make low barrier (i.e., ohmic) contacts. Examples of CdTe-based PV cells having SWNT contacts showed no sign of efficiency loss during high temperature thermal stress testing. In accordance with a method of manufacturing CdTe-based PV cells, SWNT contacts can be applied with an atmospheric pressure, ultrasonic spray process that is amenable to large areas. The SWNT contacts may also be applied by a membrane transfer process, any variety of printing processes suitable for PV formation, or any other desired deposition process.

In a method of forming a PV cell, such as PV cell 400, tested samples were produced by magnetron sputtering the semiconductor layers on soda-lime glass that had been coated with a thin fluorine-doped tin oxide (FTO) transparent conducting layer. The sputtered semiconductor surfaces were exposed to the $CdCl_2$ activation process. The resulting samples of PV cells exhibited deposited n-type CdS and p-type CdTe layers that were typically 80 nm and 1.5 micron thick, respectively. This configuration forms a baseline sample with a generally known efficiency of 10%, utilizing a standard Au/Cu back contact and under a simulated solar radiation of AM1.5G. The SWNTs were produced by a laser vaporization technique. The SWNT layers were prepared on the back surface of the CdTe devices by membrane transfer and also by ultrasonic spraying. Both techniques yielded similar results and evaluations have focused on spraying application methods due to the easier scalability of the process. In another embodiment, the SWNT layer, after having been applied to the CdTe layer, may also be exposed to the $CdCl^2$ activation process.

Figure 10:
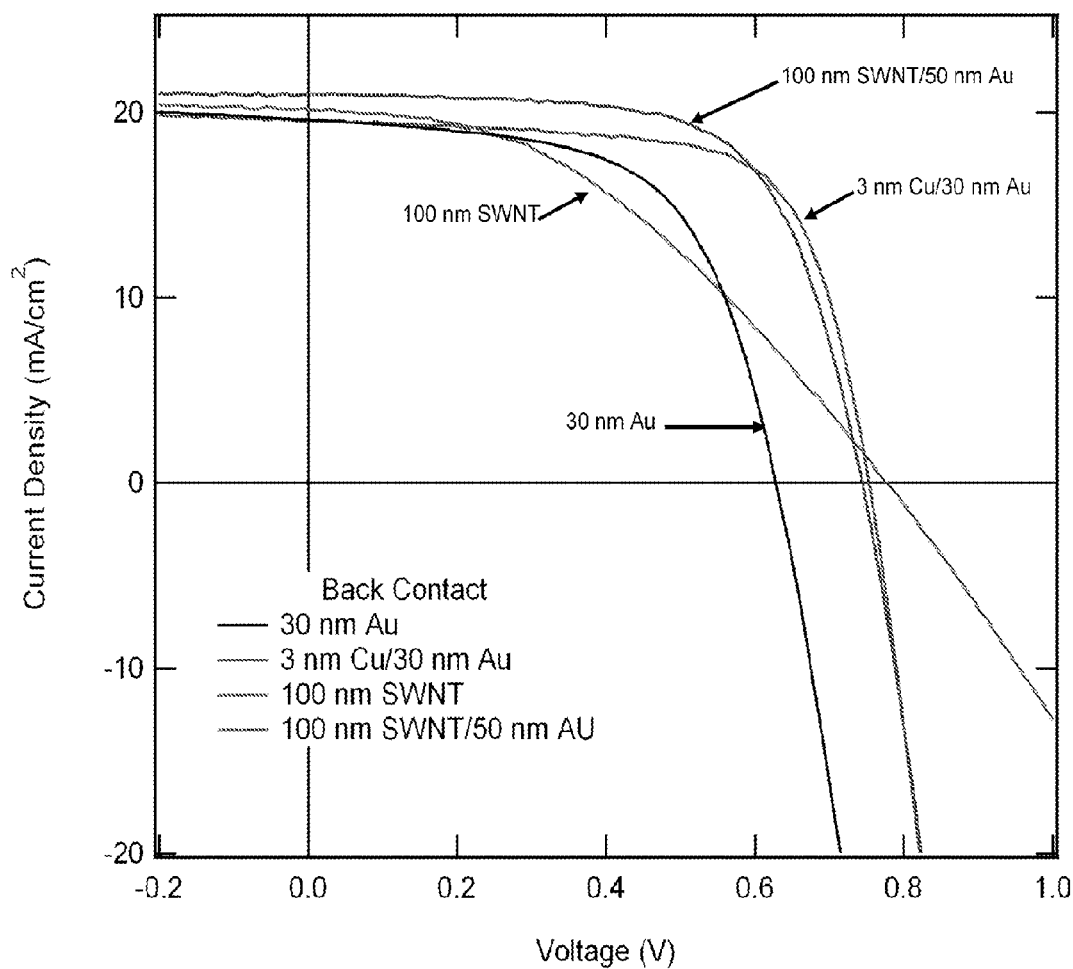
FIG. 10 is a plot of current density vs. voltage of CdTe devices with Au, Cu/Au, single wall carbon nanotube (SWNT), and SWNT/Au back contact configurations.

Referring now to FIG. 10, comparative curves of current density (J-or-mA/cm$^2$) versus voltage (V) for CdTe-based PV cell devices having different back contacts are presented. These values, along with other calculated key parameters, are also presented in the table shown in FIG. 15. As shown in FIG. 10, an evaporated, 30 nm thick Au contact produced a J/V response under simulated AM1.5 radiation with a short circuit current density ($J_{SC}$) of 19.5 mA/cm$^2$, which is good for this device construction, but the open circuit voltage ($V_{OC}$) and efficiency (η) were poor. The $V_{OC}$ is low because, even with a relatively high work function (φ=5.1 eV), Au creates an undesired Schottky barrier at the back contact that impedes majority carrier transport out the back of the device. When a 3 nm layer of Cu is evaporated before the Au, and the device is subsequently heated for 30 min at 150° C. in air to promote diffusion of Cu into the CdTe, the $V_{OC}$ improves from 665 to 757 mV, and the efficiency improves from 7.8 to 10.2%. The improvement in performance with the addition of Cu underscores the benefit of eliminating the ~300 mV back potential barrier, which can be typical of gold and other contacts. Typically, though not required, the use of the Au/Cu contact may often be applicable in laboratory environments and commercial applications may use Cu over-coated with an oxidation resistant material, such as Cr.

As previously stated above, the difficulty in making low resistance electrical contacts to p-type CdTe can be generally attributed to a low carrier concentration and an energetically deep valence band. This difficulty has been overcome by introduction of extrinsic doping at the CdTe back surface to reduce the space charge region thickness and allow defect-assisted carrier tunneling. Introduction of Cu as the dopant at the CdTe back surface sufficiently overcomes these difficulties. As described above, however, introducing a barrier layer comprising a semiconductor, such as the CdS barrier layer mitigates migration of Cu into the CdTe layer. The SWNT layer 412 of FIG. 9 is configured to make a low barrier contact to the CdTe, thereby eliminating the need for Cu in the device, particularly at the CdTe/back contact interface.

FIG. 10 shows J/V curves for a PV cell device finished with a pure 100 nm SWNT layer and a second device having a 100 nm SWNT layer over-coated with 50 nm of Au. The PV cell utilizing only the SWNT layer (the "neat" SWNT layer) shows the highest $V_{OC}$ (778 mV). The high $V_{OC}$ indicates ohmic contact with the CdTe layer. The Au/SWNT was not heated after Au deposition, and the neat SWNT layers were only heated as required during SWNT spraying (140° C.), surfactant removal (50° C.), and layer drying steps (80° C.). Although the spraying temperature is comparable to the temperature required to produce diffusion with a Au/Cu contact, the SWNT layer is more thermally stable since no metals are present, as evidenced by the results from heat treatments to 300° C. as shown in FIG. 15. The high $V_{OC}$ indicates that the band alignment energetics at the SWNT/CdTe interface produce a low potential barrier to majority carrier flow without requiring introduction of mobile Cu species.

As can be seen from the table of FIG. 15, the fill factor (FF) for the neat SWNT layer is low (39%), so the photovoltaics conversion efficiency is also low (6.15%). While again not wishing to be bound by theory or conjecture, the inventors believe that the low FF is likely due to the significant sheet resistance of the SWNT layer. This condition arises because the data are collected by pressing a single 1.0 mm diameter spring-loaded pin into the SWNT layer to collect current from the entire device area, thus, affecting the total circuit. Once the lateral conductivity within the SWNT layer is improved by over-coating with 50 nm of Au, the FF improves dramatically and η is found to be slightly higher than in the Au/Cu reference device (10.4 vs. 10.2%, respectively).

The curves in FIG. 10 represent data from hundreds of individual devices that were examined for each type of back contact. The devices compared in a given data set were prepared from 1"×1" samples that were cut from larger 3"×5.5" plates. Each 1"×1" sample yielded 24 individual 3 mm×3 mm devices after laser scribing. With this approach, variation in device performance due to factors other than the back contact formulation could be minimized such that experimental statistics could be determined. FIG. 15 shows PV performance metrics for a data set obtained with samples from a single CdTe plate. In this case, the 3 worst and 3 best devices from a 1"×1" sample were eliminated and average data for 18 devices is presented. The average results are consistent with the representative curves displayed in FIG. 10.

Figure 13:
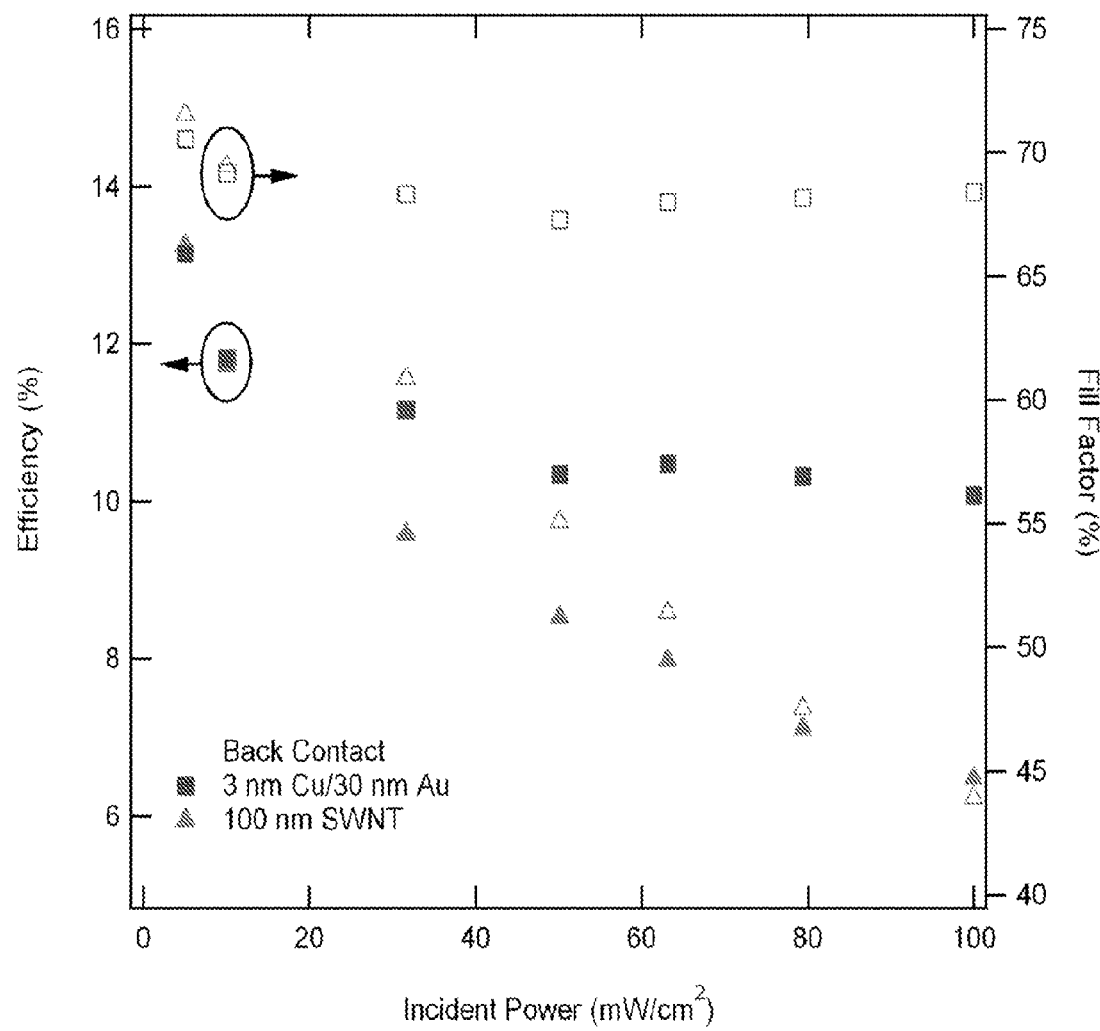
FIG. 13 is a plot of efficiency vs. Fill Factor, as a function of light intensity, of CdTe-based PV cells having SWNT and Cu/Au back contacts.
Figure 14:
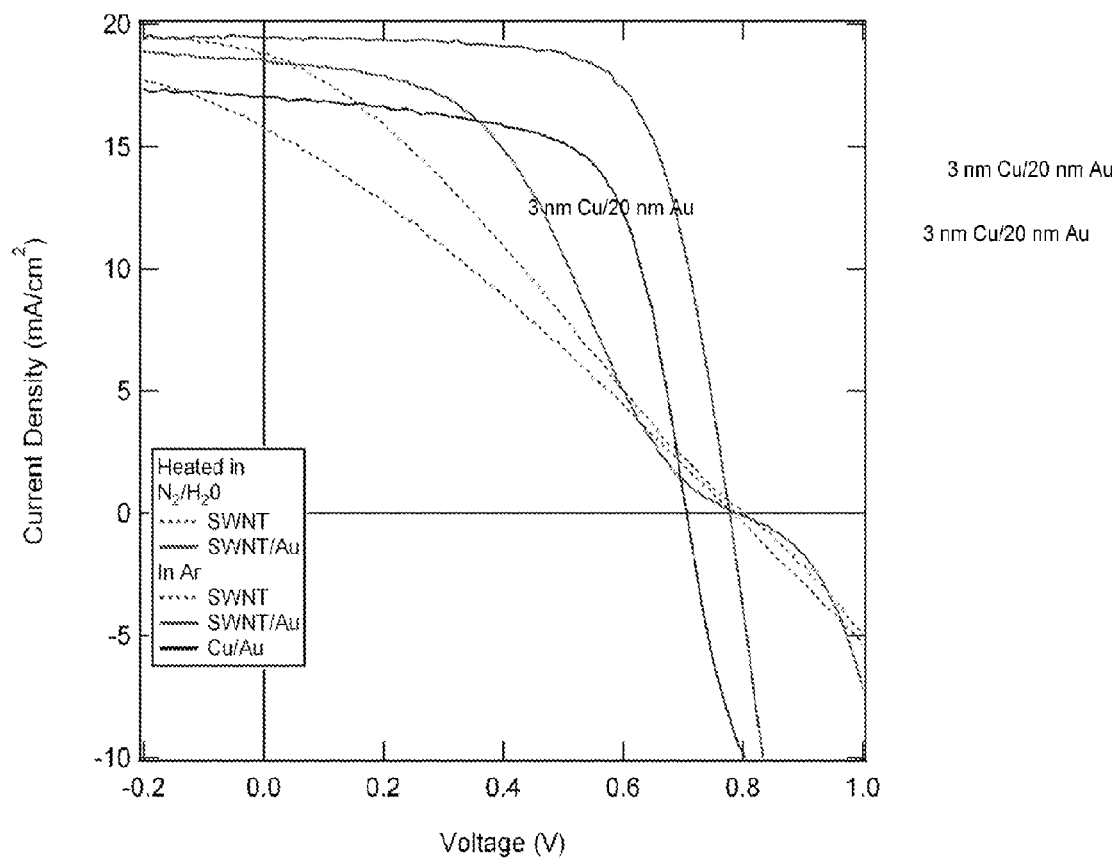
FIG. 14 is a plot of current-voltage (JV) curves of CdTe devices after heating at 300° C. for 10 minutes.

The sheet resistance of the neat SWNT layers limits the performance of the devices before application of the Au layer, as evidenced by a comparison of the J-V behavior for Au/Cu and SWNT contacted devices as a function of light intensity. Referring now to FIG. 13, the FF and η for a Au/Cu device remains nearly constant as the intensity is reduced from 100 to 50 mW/cm$^2$. The equation below shows the relationship between J and V for a solar cell when series ($R_S$) and shunt ($R_{Sh}$) resistances are considered.

$$J = J_{Ph} - J_0 \left( \exp\left[\frac{V + JR_s}{nkT}\right] - 1 \right) - \frac{V + JR_s}{R_{sh}}$$

Here, $J_{Ph}$ is the light generated photocurrent, $J_0$ is the reverse saturation current, k is Boltzmann's constant, T is the temperature, and n is the diode quality factor. The lack of change in the FF and η while $J_{Ph}$ is reduced by a factor of two indicates that the voltage drop across the series resistance ($JR_S$), at these light intensities, is small in comparison to the bias voltage. This view is consistent with the relatively low series resistances for these samples, which is associated primarily with the resistance in the TCO layer as shown in FIG. 15. Both the FF and η improve significantly as the light intensity is reduced below 50 mW/cm². While again not wishing to be bound by theory or conjecture, the inventors believe that this is due to an increased shunt resistance associated with a reduced photoconductivity in the CdS material.

Referring again to FIG. 13, the FF and η of the neat SWNT back contact are a strong function of light intensity over the entire experimental range, as shown in FIG. 13b. Once again, the photo-generated current is reduced as the light intensity is reduced, but in this case the voltage drop across a larger shunt resistance, $R_S$, as shown in FIG. 15, is more significant. At 10 mW/cm2, the voltage drop across RS at the maximum power point becomes less than 10% of VOC and the characteristics of the two devices become quite similar. At the lowest intensities (<10 mW/cm2) the FF and η of the SWNT-contacted device actually exceeds that of the Au/Cu device. Without wishing to be bound by theory, because reducing the light intensity reduces the impact of series resistance, the increase in fill factor and efficiency of the SWNT back contact devices suggest that the lateral conductivity through the SWNT layer is responsible for the reduced values under AM1.5 illumination. Thus, we can conclude that devices with neat SWNT contacts are limited in performance by the series resistance associated with lateral charge collection in the SWNT layer. The inventors find that there is a little or no potential barrier to majority carrier flow at the SWNT/CdTe interface, and the application of a thin metal layer on top of the SWNT layer only provides needed lateral conductivity to compensate for the layer's high sheet resistance. Additionally, other methods may reduce the lateral conductivity through the SWNT layer, such as for example, chemical and polymer doping of the SWNT. Also, managing the SWNT junction-junction interface with introduction of a metal may further promote high efficiency devices.

Figure 11:
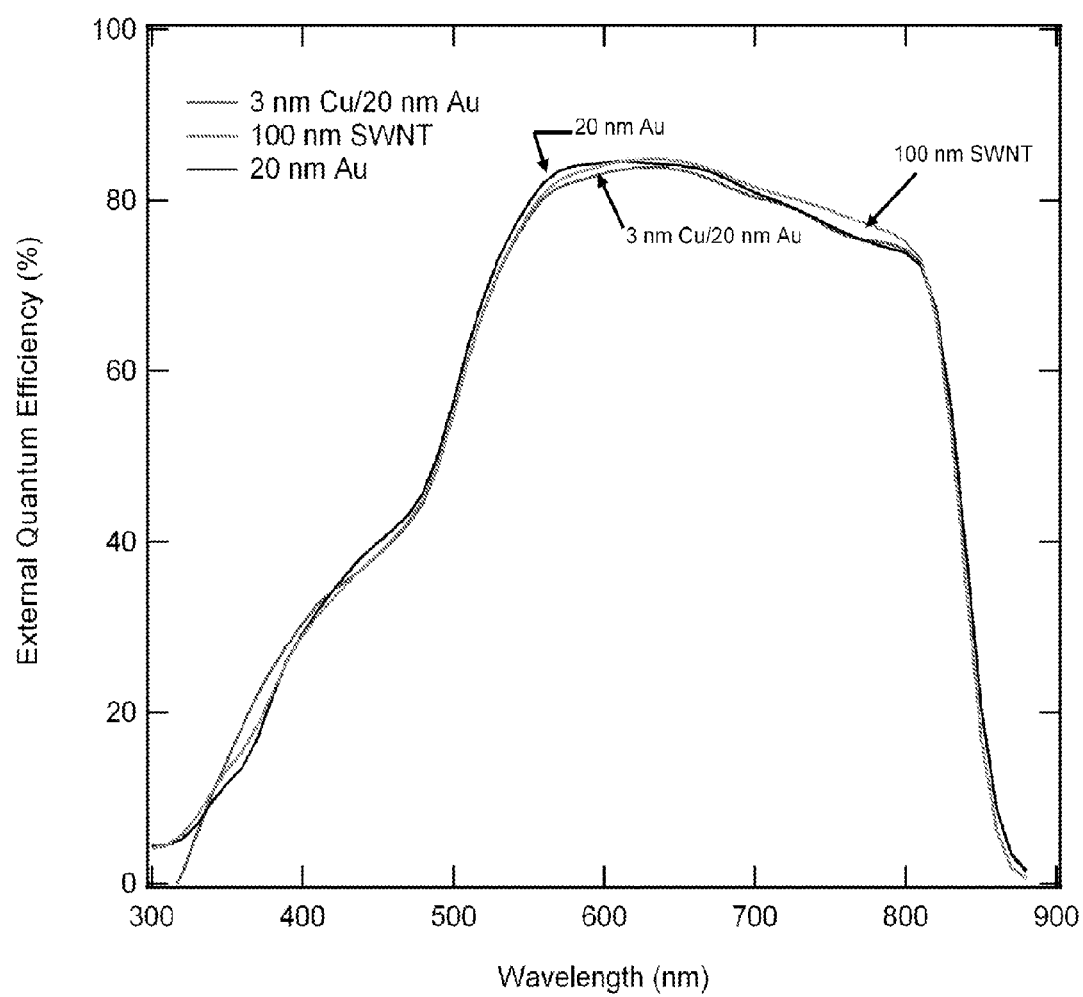
FIG. 11 is a plot of external quantum efficiency vs. wavelength of light for CdTe devices with Au, Cu/Au, and SWNT contact arrangements.

Referring now to FIG. 11, there is illustrated a plot of external quantum efficiency (EQE) of CdTe devices with Au, Cu/Au, and SWNT. EQE is the current collected at an approximate short circuit voltage, i.e., V~0. The graph shows that the current collection is generally the same for each back contact configuration. The wavelength dependence of the carrier collection efficiency was examined by external quantum efficiency (QE) measurements of devices with Au/Cu and SWNT back contacts. The current densities were low for these measurements so Au was not required to improve the lateral conductivity in the SWNT layer. The lower rate of change of QE between the 400-550 nm wavelength range is due to the relatively thick CdS layer, while the reduction in collection efficiency at longer wavelengths (550-800 nm) is associated with reflection from and absorption in the glass/FTO stack. In examining the curve closely, the collection of carriers generated at the longest wavelengths (700-800 nm) shows an efficiency improvement for the SWNT contact. The inventors believe this suggests a slower recombination velocity for minority carriers that are generated near the back contact.

The J/V curves were measured for illuminated Au/Cu and Au/SWNT devices over a temperature range spanning from 80 to 300 K. The J/V curves at each temperature were fit by linear regression to Eqn. 1 to extract the temperature-dependent values of $J_0$ and n. The temperature dependence of $J_0$ may be used to evaluate the activation energy ($E_a$) for carrier recombination according to Equation 2 where $J_{OO}$ is a pre-factor that may be assumed to be temperature independent for our purposes.

$$J_0 = J_{OO} \exp\left[\frac{-E_a}{nkT}\right]$$

Figure 12A:
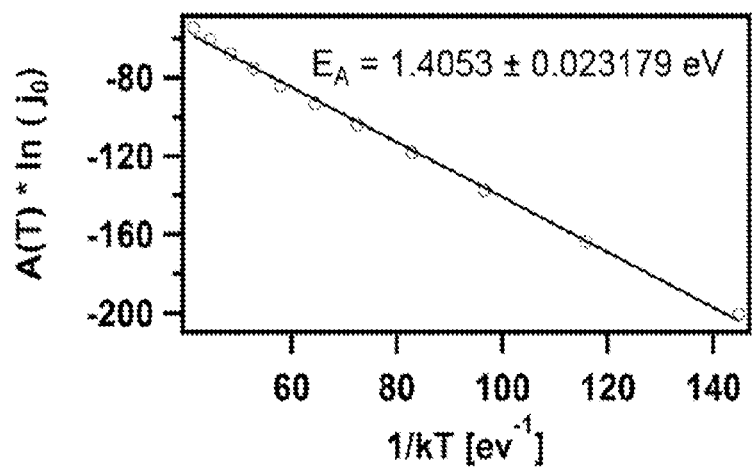
FIG. 12a is a plot of reverse saturation current ($J_0$) vs. Boltzmann distribution (1/kT) plots for a Cu/Au back contact device.
Figure 12B:
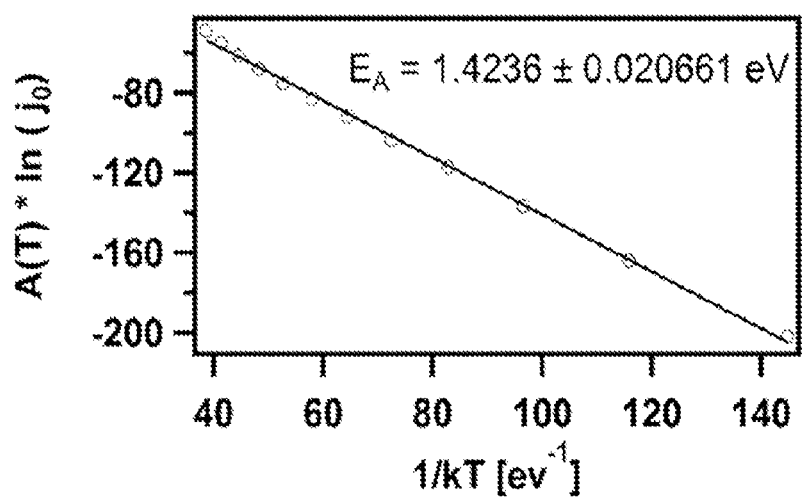

FIGS. 12a and 12b show plots of n*ln $J_0$ vs. 1/kT for devices with Au/Cu and Au/SWNT back contacts, respectively, from which the apparent activation energy for carrier recombination can be evaluated. The slopes of the linear fits give the activation energy which, in these cases, are equal for FIGS. 12a and 12b. This means that recombination occurs in the bulk of the CdTe. In both cases, $E_a$ is near the band gap of the CdTe, establishing that the dominant recombination mechanism is the same in both devices, and not a function of the back contact.

Figure 16A:
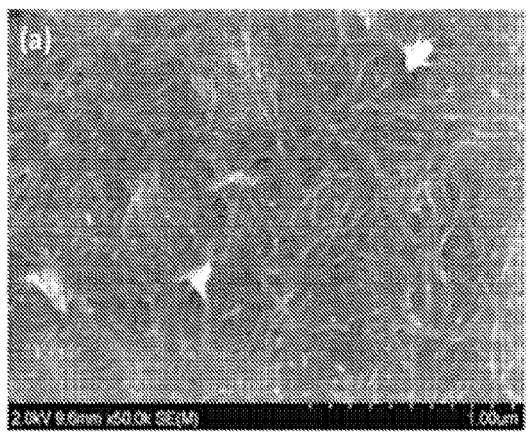
FIG. 16a is a scanning electron microscope photographic image of an SWNT/CdTe device at an accelerating voltage of 2 kV.
Figure 16B:
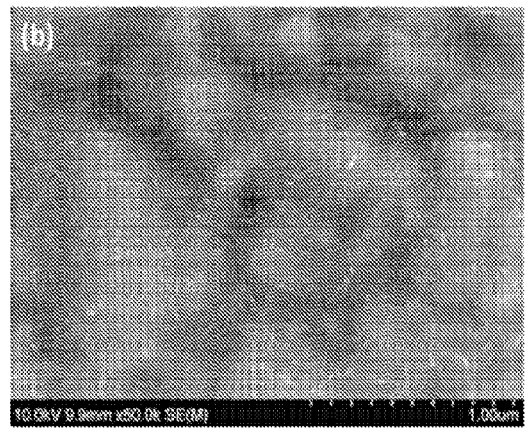
FIG. 16b is a scanning electron microscope photographic image of an SWNT/CdTe device at an accelerating voltage of 10 kV.
Figure 16C:
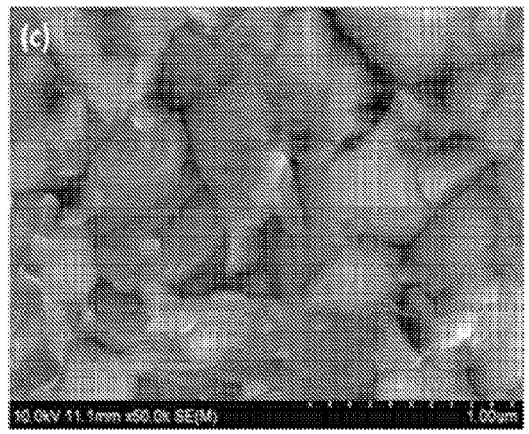
FIG. 16c is a scanning electron microscope photographic image of a bare CdTe surface.
Figure 16D:
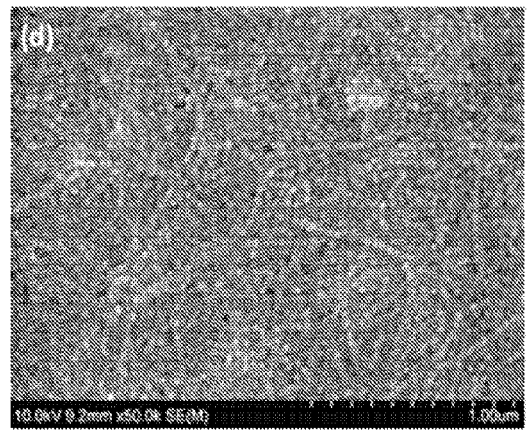
FIG. 16d is a scanning electron microscope photographic image of the SWNT surface of FIGS. 16a and 16b after Au deposition.

Referring now to FIGS. 16a-16d, scanning electron microscopy (SEM) was performed to investigate the structural characteristics of the SWNT/CdTe contact. At a relatively low acceleration potential of 2 kV, FIG. 16a shows a 100 nm SWNT layer deposited on CdTe. The SWNT layer is comprised of a fairly dense and tangled web of individual SWNTs and bundles of SWNT. As shown in FIG. 16b, when the SEM accelerating potential was increased to 10 kV and the wavelength of the incident electrons was reduced, the SWNT layer became partially transparent and the underlying CdTe grains could be imaged. The CdTe grains appear as the lighter shaded areas separated by darker, intergrain or grain boundary regions. For comparison purposes, a bare CdTe surface is shown in FIG. 16c. The SWNT layer acts as a blanket that covers and conforms to the topography of the polycrystalline CdTe thin layer. FIG. 16d shows an SEM image of a SWNT layer after deposition of 30 nm of Au. In this case, 50-100 nm Au particles are visible showing that all of the deposited Au remains on the surface of the layer. Thus, the Au decorates the SWNT bundles, but the deposited Au does not wet or penetrate the SWNT layer. This relatively small amount of superficial metal is able to improve the device efficiency by reducing $R_S$ as shown in the table of FIG. 15. The Au that decorates the SWNT layer to improve inter-tubular connectivity may be replaced by any suitable electrically conductive medium, whether metallic, polymeric, or chemical.

While not wishing to be bound by theory, the inventors have modeled interactions between the SWNT layer and the CdTe layer. The characteristics and in particular the electrical properties of the SWNT layer, for modeling purposes, are different from those in a conventional metal or semiconductor PV device layer. For example, charge transport is ballistic within individual SWNTs while long-range conduction is impeded by the multitude of tube-tube junctions that are present in a layer. Further complexity arises because the layer is comprised of s-SWNTs and m-SWNTs in a ratio of approximately 2 to 1. The SEM images of FIGS. 16a-d support the conclusion that the layer cannot be modeled as a homogeneous layer with isotropic properties. For modeling purposes, as is depicted in FIGS. 16a-d, the SWNTs are assumed to have a generally random orientation. Thus, some tubes will span the distance between the layer's surfaces that abut adjacent contacting layers.

To estimate the number of nanotubes that span the layer, a first assumption is to consider rigid nanotubes of length L and a layer of thickness T, and the surface area of a sphere swept-out by rotating a single tube through all angles about its midpoint. For a SWNT with a midpoint that is located on the midplane of the layer, the probability ($P_S$) that both ends of a tube will be outside the layer is given by the fraction of the surface area of the rotational sphere that is outside one surface of the layer. While not considered in this modeling scenario, it should be understood that the tube midpoints may be located anywhere throughout the thickness of the SWNT layer. In this case, $P_S$ is given by Eqn. 3.

$$P_S = \frac{\frac{\pi}{8}L - \frac{T}{2}}{\frac{\pi}{8}L + \frac{T}{2}}$$

Using previous results for SWNTs prepared similarly, the nanotube length, L is taken to be 500 nm. The SWNT layer thickness, T was determined to be 100 nm from optical profilometry and absorption spectroscopy measurements. Thus, approximately 60% of the SWNTs span the layer. The total number of SWNTs that span the layer can be estimated by the relationship:

$$n = V_f \frac{4T}{\pi D^2 L}$$

where, Vf is the volume fraction occupied by the SWNTs and D is the SWNT diameter. Taking D to be 1.6 nm to account for ½ of a van der Waals spacing around each tube, and $V_f$ to be 56%, the number of SWNTs spanning a 100 nm layer, i.e. n times $P_S$, is estimated to be $3.51 \times 10^4$ µm$^{-2}$, which is consistent with 2D conductivity. This estimate is further supported by virtue of L>>T and that all SWNTs are contained within the layer. Even though, in a 2D limit that might be achieved with layer-by-layer deposition, no SWNTs would extend across the layer, resulting in poor transport perpendicular to the layer and much higher values of $R_S$ would be expected even after deposition of gold. In actuality, $R_S$ of SWNT-contacted devices is low after a thin Au layer is applied and comparable to $R_S$ for the Au/Cu contact, as shown in the table of FIG. 15. Consistently, the temperature dependence of Rs for a device with a Au/SWNT contact varied by only +/−5% from 80 to 300 K, while tube-tube transport would exhibit a variation of at least a factor of two over a similar temperature range.

The SWNTs are quite flexible and, with L≈5*T, may span a layer several times. Alternatively, if a tube traverses the layer only once, multiple points will exist which contact one or both surfaces of the layer. The value of L used here is a mean value from the log-normal distribution of lengths produced by sonication, so the number of tubes longer than L is greater than the number of tubes that are shorter. This would lead to a higher density estimate of nanotubes spanning the layer. On the other hand, the SEM images of FIGS. 16a-d show that the SWNT layers are not entirely conformal to the nooks and crannies between CdTe grains. This consideration reduces the fraction of spanning tubes that could produce contacts. While the highly idealized rigid-rod approximation indicates that a large number of nanotubes span the SWNT layer, even if 1% of the rigid-rod tubes make a good electrical, several hundred contacts could be made to each 1 micron-sized CdTe grain.

The adherence of the neat SWNTs to the CdTe surface has proven to be extremely high. While again not wishing to be bound by theory, the high bond affinity, and particularly the microscopic aspects of layer adhesion, is believed to be attributable to charge transfer interactions between the SWNTs and the CdTe semiconductor surface.

At the specific sites where SWNTs contact the individual CdTe grains, nanoscale junctions with differing electronic properties are formed. These electrical properties depend on whether the contacting SWNTs possess metallic (m-SWNT) or semiconducting (s-SWNT) characteristics. Based on predictive modeling of the number of SWNTs and junctions formed with the CdTe layer (i.e., a large contact density), each individual grain of the CdTe semiconducting layer will be simultaneously "wired-up" by both s-SWNTs and m-SWNTs. The two different subsets of contacts offer parallel and independent networks for charge transport across the layer: one consisting of m-SWNTs and another consisting of s-SWNTs. The characteristics of each of these networks can be considered separately.

Figure 17:
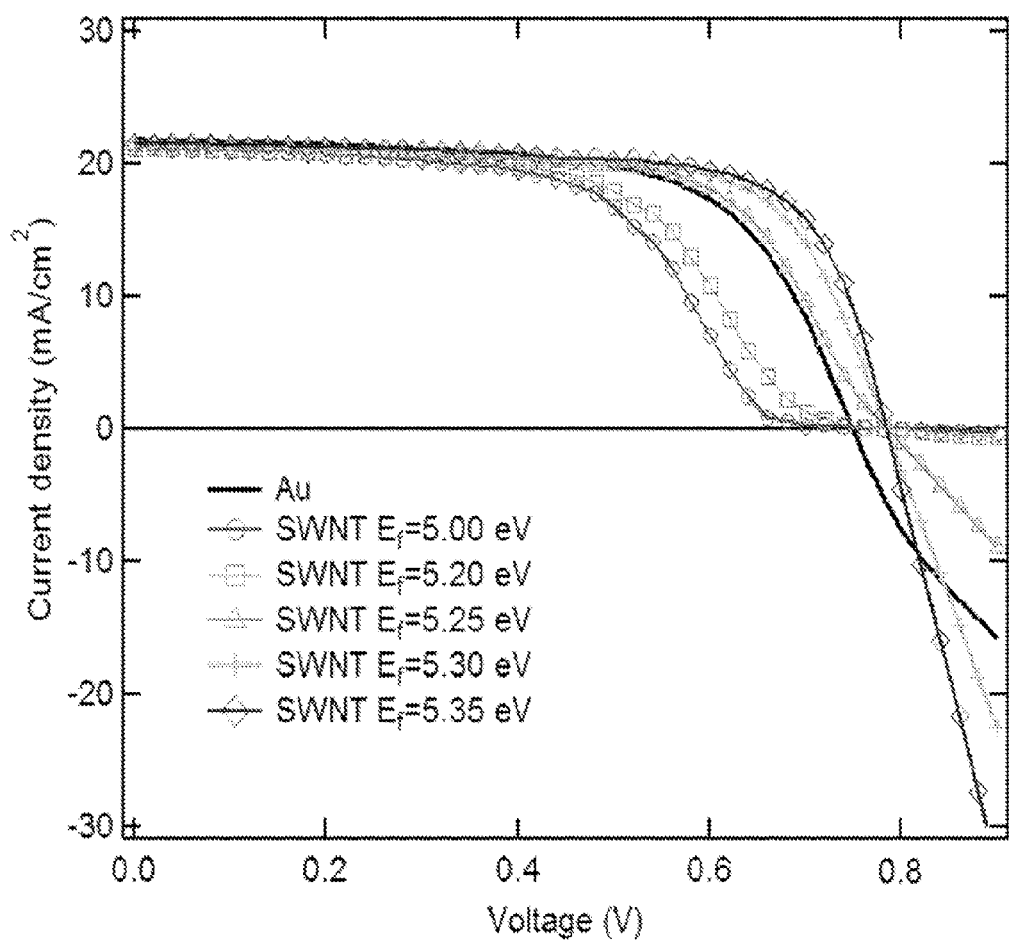
FIG. 17 is a plot of J/V simulations for Au and SWNT back contacts to p-type CdTe PV devices.
Figure 18:
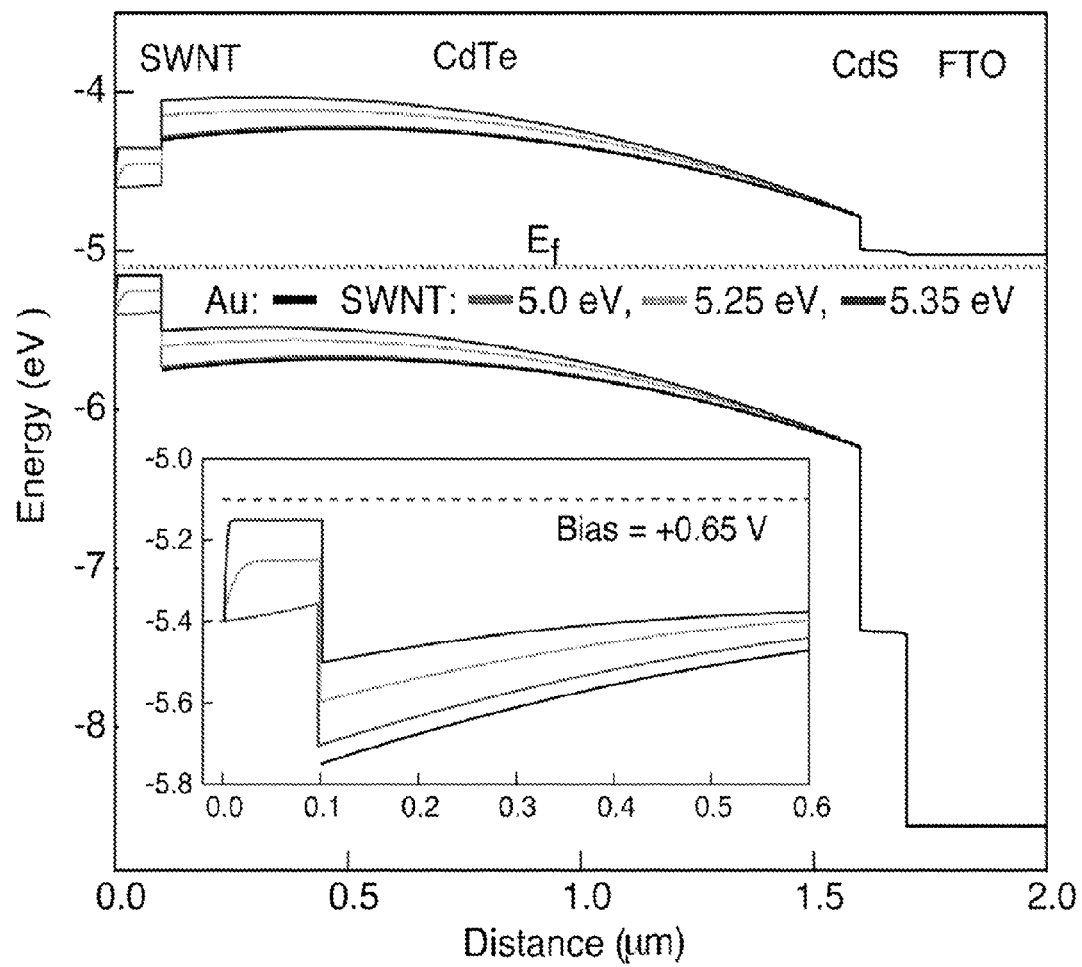
FIG. 18 is a plot of simulated band diagrams at short circuit corresponding to the J/V responses of FIG. 17.

While not wishing to be bound by theory, Solar Cell Capacitance Simulator (SCAPS) device modeling software was used to model the s-SWNT network and m-SWNT network back contacts separately. First, the model was verified for the Au case and "rollover" due to a Schottky barrier at the back contact was reproduced. The simulated response with a Au contact shows a reduced $V_{OC}$, which is in agreement with the experimental data shown in FIG. 10. The rollover in the J/V response becomes apparent in forward bias when holes moving from the Au must surmount an 0.65 eV Schottky barrier at the simulated Au/p-CdTe interface. FIGS. 17 and 18, respectively, illustrate simulated J/V curves and the corresponding device band diagram at short circuit for the Au contacts to p-CdTe. Band bending in the CdTe valence band creates an electric field that opposes hole transport to the back of the device. Holes moving toward the back contact must gain potential energy and, therefore, a voltage is produced that is in opposition to the output voltage of the PV device.

The work function of m-SWNTs is similar to that of graphite (5 eV), as described above, so the m-SWNTs will generally form junctions with the CdTe that are rectifying, without the assistance of dopants, such as for example Cu or Hg. The work function for m-SWNTs is less than the work function of Au, so the loss in $V_{OC}$ and the degree of rollover in the J/V curves is more pronounced in comparison to the Au contact, as can be seen when comparing the data on FIG. 10 and simulations in FIGS. 17 and 18. As with Au, there will be a significant barrier to hole transport in both forward and reverse biases. While not wishing to be bound by theory, the modeling suggests that m-SWNTs are not structured to create the same high quality back contact as the s-SWNTs. The same model, however, indicates that the m-SWNTs are not detrimental to contact formation.

Using values for the s-SWNT previously measured by the inventors, the model was used to generate J/V and band diagrams for devices with the s-SWNT back contact. As shown in FIG. 17, the s-SWNT curves were generated for undoped s-SWNTs ($E_f$=5.0 eV) and for s-SWNTs with increasing levels of p-type doping that moved $E_f$ closer to the SWNT valence band ($E_f$=5.2, 5.25, 5.3, and 5.35 eV). The s-SWNT band gap and electron affinity were fixed at 0.8 eV and 4.6 eV, respectively. Regarding FIG. 18, the inset shows an expanded view of the valence bands near the back contact. The modeling results indicate that increased doping of the s-SWNT will result in a lower barrier at the back contact, suggesting that doped s-SWNT may be responsible for the high efficiency devices.

It is known that s-SWNTs are easily doped p-type by charge transfer interactions with a variety of acids. Even without purposeful doping, dipolar interactions with proximal water can induce p-type doping in aqueous solutions. In solution, the degree of doping is governed by interactions with water, protons, and other species, and depends on the compactness of the surfactant sheath. For example, the first optical transition for s-SWNTs ($S_{11}$) are nearly completely bleached in aqueous sodium dodecyl sulfate (SDS) stabilized solutions, while stronger surfactants that form a more compact sheath such as sodium cholate and carboxymethyl cellulose (CMC) prohibit doping by shielding against interactions with water. Sodium dodecylbenzene sulfonate (SDBS) is an intermediate case, where some quenching of the $S_{11}$ transition is seen, but the degree of doping is not so great to allow us to assert that $E_F$ is at or near the valence band edge.

Figure 19:
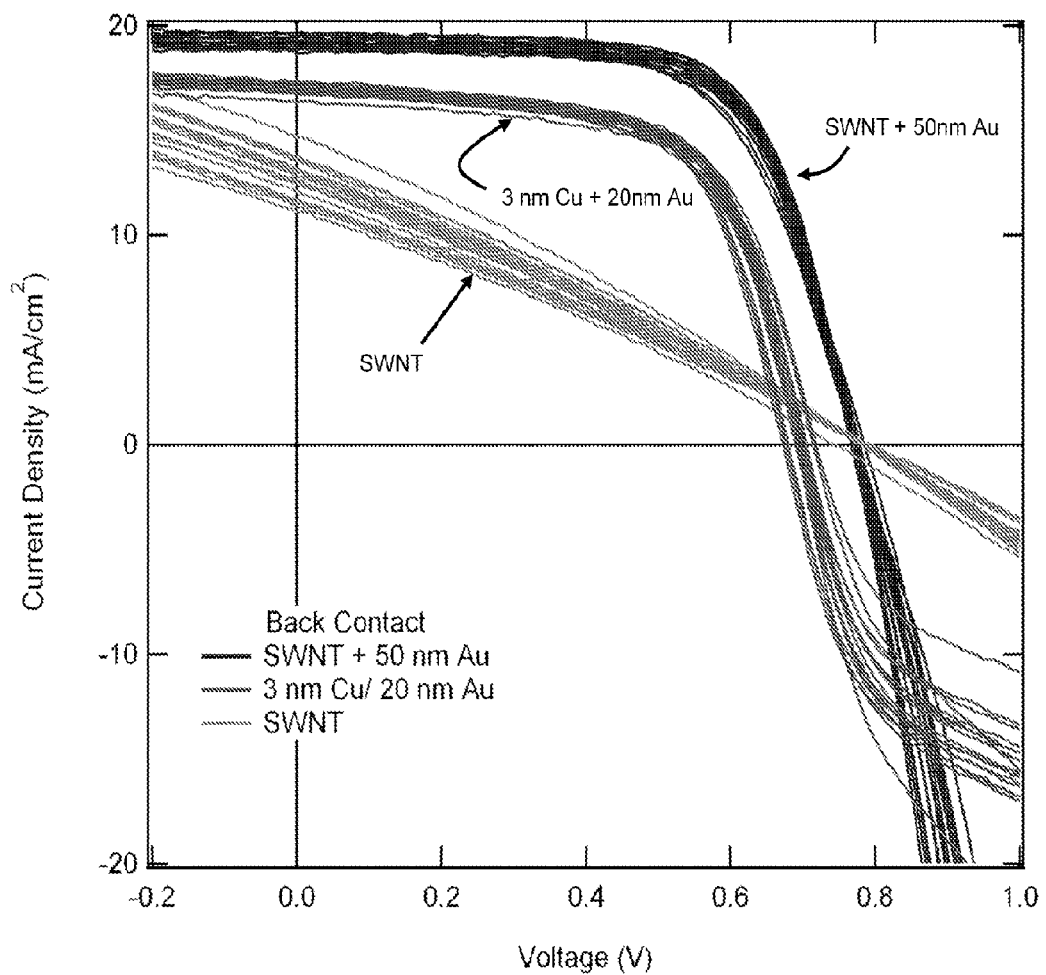
FIG. 19 is a plot of J/V responses, after heating CdTe devices with SWNT and Au/Cu back contacts.

While the doping level of the s-SWNT can be difficult to ascertain in the device, the s-SWNT can be dedoped through thermal treatment. Thermal cycling also exacerbates Cu migration into the semiconductor layers, which may cause shunts or the appearance of a Schottky barrier. A SWNT back contact that eliminates the application of Cu at the back contact to CdTe interface would stop the migration problem. However, thermal cycling is a condition all PV devices are exposed to, whether from external or internal factors. Thus, evaluating the thermal stability of SWNT contacts, both with and without a Cu or Au outer layer, provides a basis to rate the effectiveness and viability of such a structure. In one aspect of the invention, SWNT back contacts having no Cu purposefully doped onto the CdTe surface show the benefits of high $V_{OC}$ values and no rollover effects after exposure. To validate this aspect, CdTe devices with SWNT and Au/Cu back contacts were heated under flowing Ar at 300° C. for 10 minutes and the J/V curves were recorded. FIG. 19 shows the J/V response after heating CdTe devices with SWNT, SWNT/Au, and Au/Cu back contacts to 300° C. under Ar flow for 10 minutes. Curves for eighteen devices in each category are shown.

After the heat treatment exposure, the Au/Cu devices showed a reduced $V_{OC}$ and the rollover behavior that is characteristic of a Schottky barrier at the back contact. The change in the J/V response in comparison to the response of the unheated device, shown in FIG. 10, is a classic example of device degradation due to loss of Cu from the back contact interface. In contrast, the SWNT contact exhibits no sign of rollover after the heat treatment. Although the FF and $J_{SC}$ values are lower than for the unheated device in FIG. 10, the $V_{OC}$ remains high. A high $V_{OC}$ indicates that the energetics of the band alignment at the SWNT/CdTe back contact are not affected by the heat treatment. The heat treatment, however, causes environmental dopants to thermally desorb from the SWNT layer leading to a higher sheet resistance in the SWNT layer and a reduced FF. Similarly, $J_{SC}$ is reduced because the increased $R_S$ decreases the effective area over which carriers are collected by the contacting pin. Improvement in the J/V response returns once a thin layer of Au is deposited over the SWNT layer. Heat treatment of devices over-coated with Au exhibited diffusion of Au through the SWNT layer to the CdTe to form a back contact that was dominated by the energetics of a direct Au/CdTe contact, as evidenced when comparing the results of FIGS. 10 and 19. An alternative embodiment of the SWNT layer may further include an insulating material, such as glass, polymers, epoxies and the like that provide physical separation of the metals used to improve SWNT connectivity from the CdTe layer. The high performance of SWNT devices after thermally desorbing the dopants may question the accuracy of the model results, when compared with collected data. Thus, band alignment through doping may need to be revised.

While not wishing to be bound by theory, the physics and chemistry at the interface may need to account for local charge distributions, charge transfer interactions, and interface dipoles. Surface dipoles associated with bond polarization provide a coherent explanation of both Fermi level pinning and the Schottky barrier height dependence on interface structure. Using similar concepts, first principles density functional calculations showed that SWNTs in contact with (111) InAs surfaces may generate a shift in the vacuum level of more than 0.5 eV in either the positive or negative direction due to interface dipoles. The direction of the shift is dependent on whether the InAs surface is terminated with In or As vacancies, respectively. In effect, the surface produces doping of the SWNT by virtue of dipole induced charge transfer interactions. Though the calculations were for specific nanotube/semiconductor interfaces that allow the application of periodic boundary conditions, the principles can be generalized to polycrystalline surfaces that present many different types of crystallite facets and surface terminations as is the case with CdTe. The number of SWNT ends accessible at the film's surface may produce many types of contacts, some of which will be of low barrier and therefore dominate the transport. Additionally, induced dipoles in the nanotubes are not limited to the s-SWNT, which means the m-SWNT may also be responsible for the barrier-free contact to CdTe. While not wishing to be bound by theory, the inventors believe the low barrier may be a consequence of dipole interactions and not band alignment. Thus, this same mechanism may result in barrier-free contact to other semiconducting materials such as copper-indium-gallium-diselenide (CIGS), copper-zinc-tin-selenide (CZTS), zinc phosphide ($Zn_3P_2$), GaAs, InP, and III-V materials, as well as other crystalline, amorphous, nanocrystalline or polymeric materials and related alloys.

In another embodiment, a PV device 400 includes the semiconducting layers 416 and 418, which were grown by a high temperature vapor transport method directly onto the SWNT layer 412. In this embodiment, the transparent conducting layer 420 consists of an intrinsic zinc oxide layer 422 and an aluminum doped zinc oxide layer 424. The optional top window layer 426 need not be present in this embodiment. Device efficiencies of up to 7.5% were measured. In another embodiment, the fluorine doped tin oxide layer 414 may be replaced with another metal layer such as Mo, Ti, or Ni to improve efficiency.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A photovoltaic cell comprising:
   a substrate layer;
   a transparent conductive contact layer;
   a semiconductor comprising:
      a cadmium sulfide (CdS) first semiconductor layer having an n-type conductivity characteristic; and,
      a second semiconductor layer having a p-type conductivity characteristic and comprising a first semiconductor material; and,
   a back contact layer comprising a layer of single wall carbon nanotubes (SWNTs), wherein the layer of SWNTs comprises the SWNTs and a second semiconductor material different from the first semiconductor material, wherein the SWNT layer is a film that covers and conforms to the topography of the second semiconductor layer;

the back contact layer being adjacent to, and in electrical communication with, the second semiconductor layer at an interface with the second semiconductor layer, the interface having a substantially copper-free chemistry;

wherein the photovoltaic cell is free of a back contact containing metal.

2. The photovoltaic cell of claim 1 wherein the second semiconductor layer comprises one of a CdTe layer and a ZnTe layer, and the back contact layer is in contact with the second semiconductor layer.

3. The photovoltaic cell of claim 1 wherein the SWNT layer has a thickness in a range of about 1 nanometer to about 5000 nanometers.

4. The photovoltaic cell of claim 1 wherein the SWNT layer provides a buffer characteristic of the back contact layer that inhibits migration of deleterious elemental species to the semiconductor.

5. The photovoltaic cell of claim 1 wherein the back contact layer includes an additional constituent in the form of one of an element, material, or chemical species that improve one of conductivity and doping level of the SWNT layer.

6. The photovoltaic cell of claim 1 wherein the SWNT layer defines a first side that forms an electrical contact junction with the second semiconductor layer and defines a second side that is opposite the first side and is in electrical communication with a third layer.

7. The photovoltaic cell of claim 6 wherein the SWNT layer provides a buffer characteristic of the back contact layer, the buffer characteristic being a substantial inhibitor to shunt formation in the semiconductor.

8. The photovoltaic cell of claim 1 wherein the SWNT layer is substantially a semiconductor SWNT (s-SWNT) layer.

9. The photovoltaic cell of claim 1 wherein the SWNT layer has thickness that permits light energy to pass through in an amount sufficient such that the SWNT layer is a light passing window layer.

10. The photovoltaic cell of claim 9 wherein the SWNT layer is part of a tandem photovoltaic device.

11. The photovoltaic cell of claim 10 wherein the SWNT layer defines a tunneling connection between adjacent photovoltaic devices in the tandem photovoltaic device.

12. A photovoltaic cell comprising:
a front window layer including at least one of a glass material and a polymer material;
a transparent conductive oxide layer arranged to form a first ohmic contact;
a semiconductor comprising:
a first semiconductor layer having an n-type conductivity characteristic; and,
a second semiconductor layer having a p-type conductivity characteristic, the second semiconductor layer being substantially free of mobile Cu species; and,
a back contact layer having single wall carbon nanotubes (SWNTs) adjacent to, and in electrical communication with, the second semiconductor layer, wherein the SWNT layer is a film that covers and conforms to the topography of the second semiconductor layer; the SWNTs having at least one of a metallic and a semiconductor characteristic;
wherein the SWNTs are embedded within a support layer comprising a glass or a polymer;
wherein the photovoltaic cell is free of a back contact containing metal.

13. The photovoltaic cell of claim 12 wherein the first semiconductor layer is a CdS semiconductor layer and the second semiconductor layer is a CdTe semiconductor layer.

14. The photovoltaic cell of claim 13 wherein a third semiconductor layer having an intrinsic (i-type) conductivity characteristic is disposed between the first and the second semiconductor layers.

* * * * *